US012607672B2

(12) United States Patent
Aneja et al.

(10) Patent No.:  US 12,607,672 B2
(45) Date of Patent:  Apr. 21, 2026

(54) APPARATUS AND METHODS FOR VOLTAGE DROOP DETECTION IN DIE ARCHITECTURES

(71) Applicant: QUALCOMM Incorporated, San Diego, CA (US)

(72) Inventors: Amit Aneja, Chandler, AZ (US); Dipti Ranjan Pal, Irvine, CA (US); Kiran Kumar Malipeddi, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 287 days.

(21) Appl. No.: 18/447,446

(22) Filed: Aug. 10, 2023

(65) Prior Publication Data

US 2025/0052812 A1     Feb. 13, 2025

(51) Int. Cl.
G01R 31/317     (2006.01)

(52) U.S. Cl.
CPC ............................. G01R 31/31725 (2013.01)

(58) Field of Classification Search
CPC ....... G01R 31/31725; G06F 1/08; G06F 1/10; G06F 13/4068; G06F 1/3206; G06F 1/3234; G06F 1/324
See application file for complete search history.

(56) References Cited

U.S. PATENT DOCUMENTS

| | | | |
|---|---|---|---|
| 5,850,514 A | 12/1998 | Gonda et al. | |
| 10,790,837 B1 * | 9/2020 | Azam ................... | H03K 3/011 |

| | | | | |
|---|---|---|---|---|
| 2019/0041440 A1 * | 2/2019 | Duggal | ................. | G01R 23/15 |
| 2019/0302830 A1 * | 10/2019 | Chen | ......................... | G06F 1/08 |
| 2019/0391868 A1 | 12/2019 | Chaudhari et al. | | |
| 2020/0117554 A1 | 4/2020 | Chaudhari et al. | | |
| 2022/0365580 A1 | 11/2022 | Dibbad et al. | | |

OTHER PUBLICATIONS

Related PCT Patent Application Ser. No. PCT/US2024/032892 filed on Jun. 7, 2024; claims priority to present application: International Search Report and Written Opinion—ISA/EPO—Report Issued Sep. 17, 2024, 15 pages.

* cited by examiner

*Primary Examiner* — Alvaro E Fortich
*Assistant Examiner* — Haidong Zhang
(74) *Attorney, Agent, or Firm* — Smith, Tempel, Blaha LLC

(57)     ABSTRACT

Methods and apparatuses directed to. In some examples, a die package includes voltage logic that provides a voltage to a voltage rail, clock logic that generates a clock signal, and adaptive clock distribution logic that receives the clock signal and the voltage. The adaptive clock distribution logic can increment an event count when the clock signal is above a threshold frequency, or when the voltage is below a threshold voltage level. The die package also includes a processor that can monitor the event counts during operation and determine a status of the adaptive clock distribution logic based on the event counts. In some examples, the processor can test the adaptive clock distribution logic by causing the clock signal to operate above the threshold frequency, or causing the voltage logic to provide the voltage below the threshold voltage level. The processor can then read the event counts to determine the status.

20 Claims, 11 Drawing Sheets

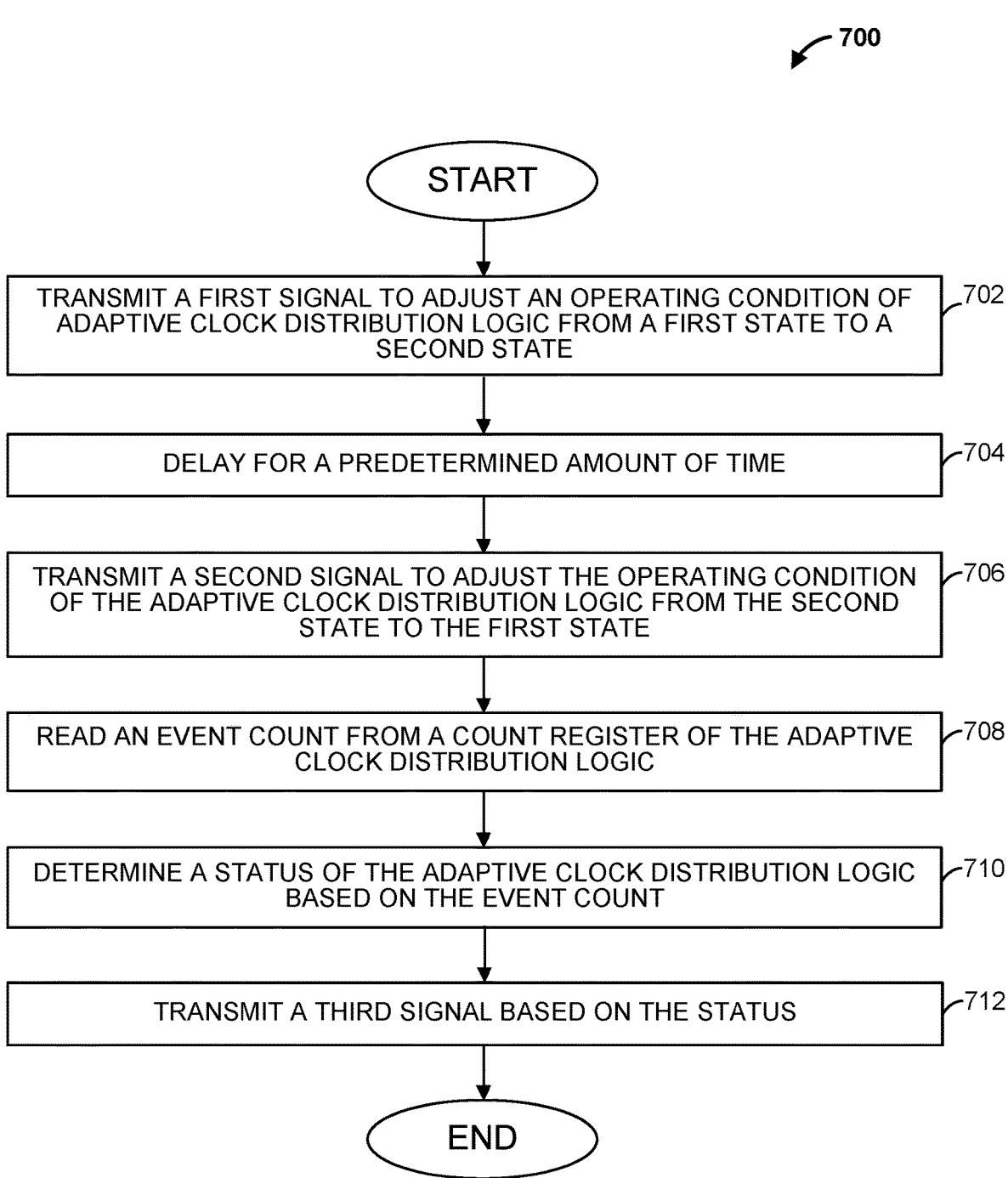

700

START

TRANSMIT A FIRST SIGNAL TO ADJUST AN OPERATING CONDITION OF ADAPTIVE CLOCK DISTRIBUTION LOGIC FROM A FIRST STATE TO A SECOND STATE ⌐702

DELAY FOR A PREDETERMINED AMOUNT OF TIME ⌐704

TRANSMIT A SECOND SIGNAL TO ADJUST THE OPERATING CONDITION OF THE ADAPTIVE CLOCK DISTRIBUTION LOGIC FROM THE SECOND STATE TO THE FIRST STATE ⌐706

READ AN EVENT COUNT FROM A COUNT REGISTER OF THE ADAPTIVE CLOCK DISTRIBUTION LOGIC ⌐708

DETERMINE A STATUS OF THE ADAPTIVE CLOCK DISTRIBUTION LOGIC BASED ON THE EVENT COUNT ⌐710

TRANSMIT A THIRD SIGNAL BASED ON THE STATUS ⌐712

END

FIG. 7

APPARATUS AND METHODS FOR VOLTAGE DROOP DETECTION IN DIE ARCHITECTURES

BACKGROUND

Field of the Disclosure

This disclosure relates generally to die architectures and, more particularly, to detecting voltage droop in die architectures.

Description of Related Art

In various applications, die architectures, such as system-on-a-chip (SoC) architectures, experience voltage droop events. For instance, a processor may receive an operating voltage from a voltage rail. If the processor's workload changes enough within a time window, the processor may suddenly begin to pull more or less current from the voltage rail thereby causing a voltage droop on the voltage rail. When a voltage droop occurs, components receiving power from the voltage rail may experience a drop in the voltage level. As a result, circuits can fail or begin to experience indeterministic behavior. Some droop mitigation efforts include operating the voltage rail at a higher voltage level in an attempt to prevent the voltage from dropping below a minimum level when a voltage droop event happens. These mechanisms, however, increase the power consumption of components, and may also increase the cost of components needed to run at the higher voltage levels.

SUMMARY

According to an aspect, a die package includes adaptive clock distribution logic and a processor electrically coupled to the adaptive clock distribution logic. The adaptive clock distribution logic is configured to detect an activation event, and increment an event count within a register based on detecting the activation event. Further, the processor is configured to access the register and read the event count within the register. The processor is also configured to compare the event count to a threshold count value. The processor is further configured to, based on the comparison, transmit a signal to at least one component electrically coupled to the die package.

According to another aspect, a method by a processor includes accessing a register of adaptive clock distribution logic configured to increment an event count within the register based on detecting an activation event, and reading the event count within the register. The method also includes comparing the event count to a threshold count value. Further, the method includes transmitting a signal to at least one device based on the comparison.

According to yet another aspect, a non-transitory, machine-readable storage medium includes instructions that, when executed by at least one processor, cause the at least one processor to perform operations. The operations include accessing a register of adaptive clock distribution logic configured to increment an event count within the register based on detecting an activation event, and reading the event count within the register. The operations also include comparing the event count to a threshold count value. Further, the operations include transmitting a signal to at least one device based on the comparison.

According to another aspect, an apparatus includes a memory storing instructions, and at least one processor communicatively coupled to the memory. The at least one processor is configured to execute the instructions to access a register of adaptive clock distribution logic configured to increment an event count within the register based on detecting an activation event, and read the event count within the register. The at least one processor is also configured to execute the instructions to compare the event count to a threshold count value. Further, the at least one processor is configured to execute the instructions to transmit a signal to at least one device based on the comparison.

BRIEF DESCRIPTION OF DRAWINGS

FIG. 7 is a flowchart of an exemplary process for testing adaptive clock distribution logic, according to some implementations.

DETAILED DESCRIPTION

Figure 1:
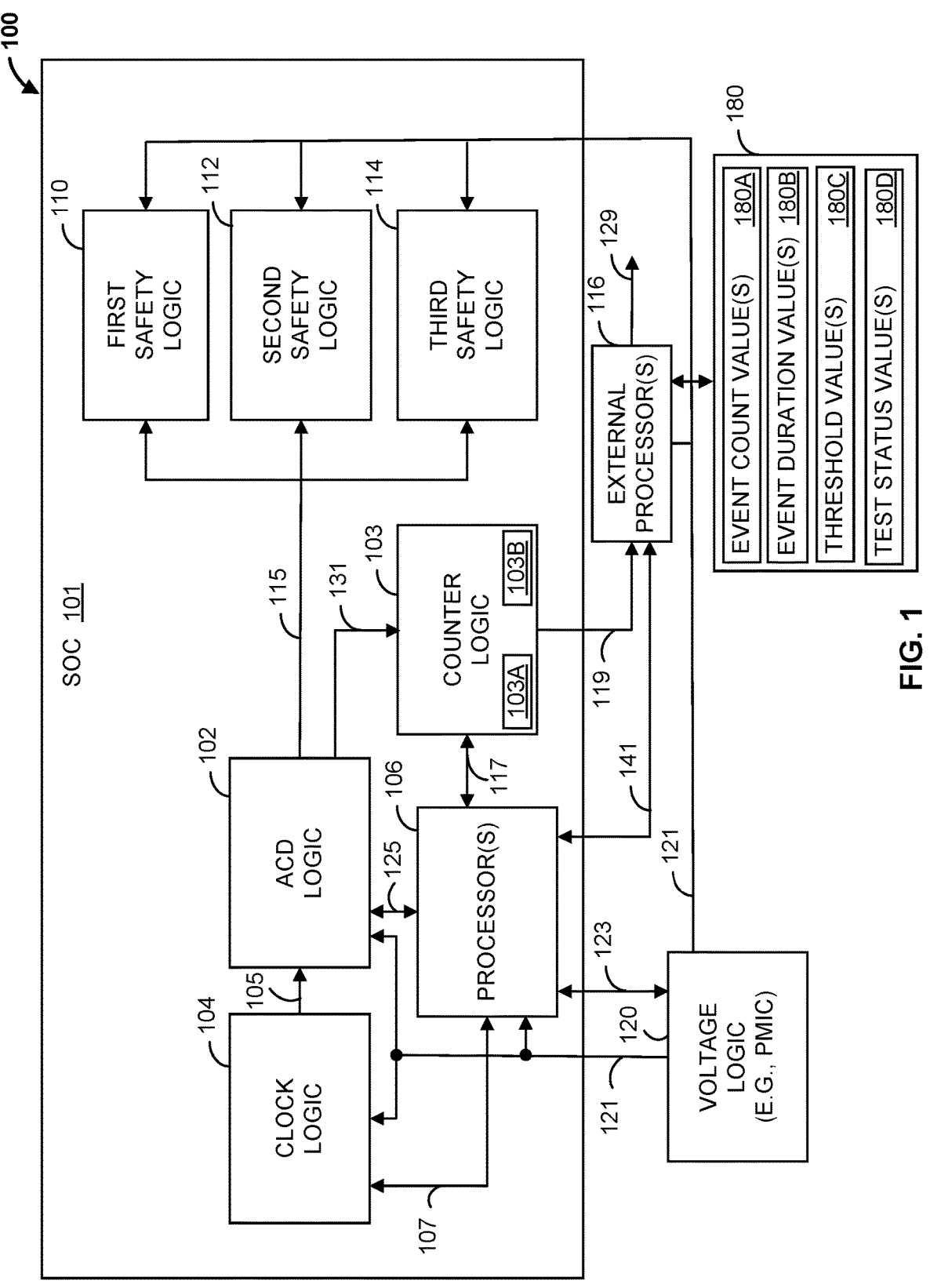
FIG. 1 is a block diagram of an integrated circuit, according to some implementations.

While the features, methods, devices, and systems described herein may be embodied in various forms, some exemplary and non-limiting embodiments are shown in the drawings, and are described below. Some of the components described in this disclosure are optional, and some implementations may include additional, different, or fewer components from those expressly described in this disclosure.

The embodiments described herein are directed to logic within die architectures that detect voltage droop events as well as the testing of the logic that detects voltage droop events. The logic may include adaptive clock distribution (ACD) functionality, which decreases a rate of an operating clock signal based on detected operating conditions.

For instance, a System-on-a-Chip (SoC) may include various components (e.g., a processor, a memory device, logic blocks, etc.) that receive a supply voltage from a voltage rail. The SoC may also include clock logic that generates an output clock signal and provides the output clock signal to the various components. For instance, the clock logic may include a phase-locked loop (PLL) based clock generator that receives an input clock signal at a first frequency, and divides the input clock signal to generate the output clock signal at a second frequency. In some examples, the PLL receives the input clock and multiplies the input clock signal to generate the output clock signal (e.g., frequency multiplication). The SoC may further include ACD logic that can detect one or more activation events. For example, at least in some instances, the ACD logic can detect when the supply voltage from the voltage rail drops below a voltage threshold (e.g., 1.2 Volts, 3.3 Volts, 5 Volts, etc.). When the ACD logic detects that the supply voltage drops below the voltage threshold, the ACD logic reduces an operating frequency of the output clock signal provided to the various components. For instance, the ACD logic may receive the clock signal (e.g., from the clock logic) at a first frequency. When the supply voltage remains at or above a voltage threshold, the ACD logic provides the clock signal at the first frequency to the various components (e.g., the ACD logic operates as a "pass-through" to the clock signal). If, however, the supply voltage drops below the voltage threshold, the ACD logic may activate and provide the clock signal to the various components at a second frequency. The second frequency may be less than the first frequency.

For example, the ACD logic may divide (or multiply, in some examples) the clock signal received from the clock logic at the first frequency by two, four, eight, or any suitable factor to reduce the clock signal from the first frequency to the second frequency. The second frequency may be half, a fourth, or an eighth of the first frequency, among other examples. The reduction in the frequency of the clock signal may reduce an amount of current pulled by the various components from the voltage rail, which may mitigate the effects of the voltage droop on the various components. When the supply voltage increases to at least the voltage threshold, the ACD logic may deactivate and the clock signal resumes operating (i.e., running) at the first frequency (e.g., the ACD logic stops dividing or multiplying the clock signal). In some instances, the ACD logic may be configured to deactivate after the supply voltage remains at or above the voltage threshold for at least a predetermined temporal interval (e.g., 100 nanoseconds, 2 milliseconds, etc.).

In some examples, the ACD logic may detect activation event when the clock signal from the clock logic operates at a frequency outside a clock frequency range, such as above an upper clock frequency threshold. When the ACD logic detects that the clock signal operates above the clock frequency threshold, the ACD logic activates and reduces the operating frequency of the clock signal from a first frequency to a second frequency, as described herein. The reduction in the frequency of the clock signal by the ACD logic may prevent the various components from operating at higher clock frequencies, which may be harmful to the components and/or cause the components to pull additional current from the voltage rail. When the clock signal reduces back to at least the clock frequency threshold, the ACD logic deactivates, and the clock signal provided to the various components resumes operating at the first frequency (e.g., original frequency). In some instances, the ACD logic may be configured to deactivate after the clock signal from the clock logic has remained at or below the clock frequency threshold for at least a predetermined temporal interval.

In some instances, and through a performance of one or more of the exemplary processes described herein, the ACD logic may mitigate effects of voltage droop events on components while allowing at least some systems to continue operating in spite of voltage droop events. Further, the ACD logic may enable a voltage rail to provision the various components of the SOC with supply voltage at a lower minimum voltage.

The use of the ACD logic alone, however, may not be sufficient for various reasons. For example, in safety critical systems, such as in automotive safety critical applications (e.g., collision avoidance, self-driving, mapping and navigation, etc.), operating frequencies cannot be reduced for relatively long and/or unknown periods of time. In addition, some safety critical applications monitor the clock signal and fail or at least generate an error if the clock signal remains below a threshold frequency level for more than threshold amount of time. In some instances, the ACD logic itself may experience a hardware fault and inadvertently activate, thereby leading to unneeded and/or prolonged periods of reduced clock signal frequencies. In such instances, components, such as a processor, may undergo unexpected or unwanted behavior. In other examples, the ACD logic may detect a voltage droop event and, in response, reduce a clock signal's frequency, but due to one or more errors may not restore the clock signal's original frequency.

To address one or more of these potential problems, in some examples, an integrated circuit performs operations that monitor the operation of an ACD logic of an SoC and, based on the monitoring, the integrated circuit may limit or even disable the ACD logic. For example, the integrated circuit may include a processor that is electrically coupled to voltage logic and ACD logic. As described herein, the ACD logic may include one or more registers that provide a corresponding event count, which may indicate a number of times that the ACD logic was activated over a time interval. As described herein, the event counts may indicate a number of voltage event counts and/or clock event counts, for instance. The processor may occasionally (e.g., periodically) access one or more of the registers of the ACD logic and read the corresponding event counts.

For each of the event counts (e.g., voltage event counts, clock event counts), the processor of the integrated circuit may determine whether the ACD logic is operating correctly based on comparing the one or more event counts to corresponding event count thresholds. The event count thresholds may correspond to expected event counts and/or event count ranges. For instance, if an event count falls within its corresponding event count range, the processor may generate a status indicating that the ACD logic passed the corresponding test and as such, that the ACD logic is operating correctly. Alternatively, if the event count fails to fall within its corresponding event count range, the processor may generate a status indicating that the corresponding test did not pass and the ACD logic is not operating correctly.

Another reason why ACD activation may happen beyond an expected range is that the set of workloads running on safety logic is such that workload transitions are happening quite often, leading to ACD activation happening quite often and, in turn, causing the ACD to slow down the clock frequency of the safety logic. In this case, although the ACD may be working correctly, this could lead to the safety logic failing to complete safety functions thereby having a FUSA_WARNING or FUSA_ERROR generated where the processor, in response to the FUSA_WARNING or FUSA_ERROR, can take necessary action to avoid failure in the safety system. A FUSA_WARNING signal may indicate that ACD events are happening quite often as preconfigured in counter thresholds and have reached a warning level, indicating that performance may be impacted as clock frequency is being slowed down to manage voltage droop events. A FUSA_ERROR signal, on the other hand, may indicate that ACD events are happening much more often or for much longer duration than expected as preconfigured in counter thresholds. Therefore performance may get severely impacted due to clock frequency slow down.

In some instances, the processor may generate the status based on which one of a multitude of event count ranges the read event count falls within. For example, the processor may generate a first status (e.g., indicative of a correctly functioning ACD logic) if an event count falls within a first range (e.g., 0 to $X_1$). In addition, the processor may generate a second status (e.g., a warning status) if the event count falls within a second range (e.g., $X_1+1$ to $X_2$), and the processor may generate a third status (e.g., an error status) if the event count falls within a third range (e.g., above $X_2$).

In some examples, an integrated circuit performs operations that test the operation of an ACD logic of a SoC and, based on the testing, the integrated circuit may limit or even disable the ACD logic. The ACD logic testing described herein may be performed prior to shipment of an integrated circuit (e.g., die package including an SoC), at every power-up of the integrated circuit, and/or occasionally through the integrated circuit's life (e.g., every hour, once a day, once a week, etc.). For example, an integrated circuit may include a processor that is electrically coupled to voltage logic and ACD logic. As described herein, the ACD logic may include one or more registers that provide a corresponding event count, which may indicate a number of times that the ACD logic was activated over a time interval. In some examples, an event count may also indicate a duration of ACD activations during the time interval. The voltage logic may be a power management IC (PMIC), for instance, or any other suitable logic that can provide a supply voltage. Further, the voltage logic may be configured to provide a supply voltage to various electrical components of an SoC, such as the processor and the ACD logic of the integrated circuit.

In some instances, the integrated circuit may perform a voltage test to test an operation of the ACD logic. For example, the processor of the integrated circuit may transmit a signal to the voltage logic, which may cause the voltage logic to reduce a supply voltage below a threshold voltage level. The threshold voltage level may be the voltage level where the ACD logic should activate to reduce a clock signal. Further, the supply voltage may be maintained below the threshold voltage level for an interval of time (e.g., 4 milliseconds, 10 milliseconds, 1 second, etc.). At the conclusion of the interval of time, the same or an additional processor reads one or more voltage test event counts from the ACD logic registers. (e.g., total event counts, total duration counts), and stores the voltage event counts within a memory device.

In addition to, or alternate to, the voltage test, the integrated circuit may perform a clock test to test an operation of the ACD logic. For example, the processor of the integrated circuit may transmit a signal to the clock logic, which may cause the clock logic to adjust the frequency of the clock signal above a threshold frequency level. The threshold frequency level may be a frequency level that should cause the ACD logic to activate and reduce the clock signal frequency. Further, the clock frequency level may be maintained above the threshold frequency level for an interval of time (e.g., 4 milliseconds, 10 milliseconds, 1 second, etc.). At the conclusion of the interval of time, the same or additional processor reads one or more clock test event counts from the ACD logic registers, and stores the clock test event counts within a memory device.

For each of the event counts (e.g., voltage event counts, clock event counts), the processor of the integrated may determine whether the ACD logic is operating correctly based on a comparison of the one or more event counts to corresponding event count thresholds. The event count thresholds may correspond to expected event counts and/or event count ranges. For instance, if an event count falls within its corresponding event count range, the processor may generate a status indicating that the ACD logic passed the corresponding test and as such, that the ACD logic is operating correctly. Alternatively, if the event count fails to fall within its corresponding event count range, the processor may generate a status indicating that the corresponding test did not pass and the ACD logic is not operating correctly.

In some instances, the processor may generate the status based on which one of a multitude of event count ranges the read event count falls within. For example, the processor may generate a first status (e.g., indicative of a correctly functioning ACD logic) if an event count falls within a first range (e.g., 0 to $X_1$). In addition, the processor may generate a second status (e.g., a warning status) if the event count falls within a second range (e.g., $X_1+1$ to $X_2$), and the processor may generate a third status (e.g., an error status) if the event count falls within a third range (e.g., above $X_2$).

In some instances, the processor generates a status indicating that the ACD logic is operating correctly only if the ACD logic passes all performed tests. If the ACD logic were to fail any of the performed tests, the processor may generate a status indicating that the ACD logic is not operating correctly. Further, in some examples, the processor transmits a second signal based on the status. For instance, if the status indicates that the ACD logic is not operating correctly, the processor may issue an error or warning interrupt to other logic (e.g., FUSA_ERROR or FUSA_WARNING), such as another processor (e.g., microcontroller unit (MCU), internal safety processor within the SoC), that handles errors. In some instances, the ACD logic may be disabled based on the error, and additionally, or alternatively, certain SoC level or system level functionality (e.g., collision avoidance features, self-driving features, mapping and navigation features, etc.) may be limited or disabled based on the error.

Among other advantages, an integrated circuit may test an operation of ACD logic within a SoC and, based on the testing, the integrated circuit may determine whether the ACD logic is operating correctly. Further, and based on the determination, the integrated circuit may enable selectively, or disable selectively, functionality of the various components of the SoC, such as functions within safety critical systems. Persons of ordinary skill in the art would appreciate these advantages, and recognize others as well.

FIG. 1 is a block diagram of an integrated circuit package 100 that includes a System-on-a-Chip (SoC) 101 electrically coupled to voltage logic 120 and one or more external processors 116. The one or more external processors 116 may further be electrically coupled to memory device 180. Voltage logic 120 may provide one or more supply voltages over one or more voltage rails 121. Although one voltage logic 120 is illustrated for simplicity, integrated circuit package 100 may include additional voltage logics 120 that provide voltage to portions of the integrated circuit package 100. For example, external processor 116 and SoC 101 may receive a voltage from separate voltage logics 120 on corresponding voltage rails 121. Further, voltage logic 120 allows for the programming of the supply voltages. For instance, voltage logic 120 may be a PMIC. Further, each external processor 116 may be, for example, a graphical processing unit (GPU), a central processing unit (CPU), a microcontroller, or any other suitable processing device.

Further, as illustrated, SoC 101 may include clock logic 104, ACD logic 102, counter logic 103, and one or more processors 106. SoC 101 may also include additional logic, such as first safety logic 110, second safety logic 112, and third safety logic 114. Clock logic 104 is electrically coupled to ACD logic 102, and may provide an input clock signal 105 to ACD logic 102. For instance, clock logic 104 may include one or more PLL circuits, clock generating circuits and clock divider circuits to provide the input clock signal 105. The input clock signal 105 may run at a programmed first frequency. For example, the clock logic 104 may include one or more registers that, when written, control the frequency of the input clock signal 105. ACD logic 102 is also electrically coupled to counter logic 103 and each of first safety logic 110, second safety logic 112, and third safety logic 114. ACD logic 102 may receive the input clock signal 105 from the clock logic, and provide an output clock signal 115 to, for example, first safety logic 110, second safety logic 112, and third safety logic 114.

As described herein, ACD logic 102 may provide the output clock signal 115 at the same frequency as the input clock signal 105 when the ACD logic 102 is not activated. For example, the ACD logic 102 may allow the input clock signal 105 to "pass-through" when in a deactivated state. The ACD logic 102, however, may activate when it detects that a supply voltage from the voltage rail 121 is outside a range. For example, the ACD logic 102 may activate when the supply voltage falls below a voltage threshold (e.g., during workload transition events). The ACD logic 102 may, additionally or alternatively, activate when a frequency of the input clock signal 105 is outside a corresponding range. For example, the ACD logic 102 may activate when the input clock signal 105 is operating at a frequency above a clock frequency threshold. When the ACD logic 102 activates, the ACD logic 102 generates the output clock signal 115 to be at a frequency that is less than the frequency of the input clock signal 105. For example, as described herein, the ACD logic 102 may divide the input clock signal 105 by a factor (e.g., which may be programmed within a register) to generate the output clock signal 115. The frequency of the output clock signal 115 may be, for example, half of the frequency of the input clock signal 105 when the input clock signal 105 is divided by two.

When the ACD logic 102 activates, the ACD logic 102 may generate an ACD event signal 131 that is provided to counter logic 103. For instance, when no event is being detected, the ACD logic 102 may provide the ACD event signal 131 at a first voltage level (e.g., 0 Volts). Upon detecting an event (e.g., supply voltage outside a range, input clock signal 105 outside a range), however, the ACD logic 102 may provide the ACD event signal 131 at a second voltage level (e.g., 3.3 Volts). The ACD logic 102 may maintain the ACD event signal 131 at the second voltage level until the ACD logic 102 determines the event no longer exists. In some instances, the ACD logic 102 provides the ACD event signal 131 as a pulse when an event is detected, or may use any other suitable mechanism to indicate the event.

The counter logic 103 may detect the voltage level of the ACD event signal 131, and may increment one or more counters when the ACD event signal 131 indicates that an event exists. For example, the counter logic 103 may include an event count counter 103A that increments when the ACD event signal 131 indicates a new event, such as, in some examples, when the ACD event signal 131 transitions from the first voltage level to the second voltage level (e.g., either based on edge detection or level detection). Thus, for instance, assuming starting with an event count of zero, when the ACD event signal 131 transitions from the first voltage level to the second voltage level, the event count counter 103A increments to one. The event count counter 103A remains at one even after the ACD event signal 131 transitions back to the first voltage level. If the ACD event signal 131 transitions again to the second voltage level from the first voltage level, the counter logic 103 increments the event count counter 103A again to reach a value of two.

Additionally or alternatively, the counter logic 103 may include an event duration counter 103B that increments periodically when the ACD event signal 131 indicates an event. For example, when the ACD event signal 131 is at the second voltage level indicating an event, the event duration counter 103B may increment every temporal interval, where the temporal interval is a predetermined value (e.g., 1 nanosecond, 1 microsecond, 1 millisecond, etc.). Thus, for instance, again assuming starting with an event count of zero, when the ACD event signal 131 transitions from the first voltage level to the second voltage level, the event duration counter 103B increments to one, and then increments again every temporal interval as long as the ACD event signal 131 continues to indicate the same event (e.g., as long as the ACD event signal 131 remains at the second voltage level). Once the ACD event signal 131 indicates the event is no longer present (e.g., when the ACD event signal 131 transitions from the second voltage level to the first voltage level), the event duration counter 103B stops incrementing. As such, the event duration counter 103B characterizes a duration of one or more ACD logic 102 activations. In some instances, when the ACD event signal 131 indicates the event is no longer present, the counter logic 103 stores the value within a memory component (e.g., first-in, first-out (FIFO) memory component), and resets the event duration counter 103B (e.g., to zero).

Each of the first safety logic 110, second safety logic 112, and third safety logic 114, which receive the output clock signal 115 from the ACD logic 102, may include any logic that is to be protected (e.g., with receiving a reduced frequency of the input clock signal 105). For example, any of first safety logic 110, second safety logic 112, and third safety logic 114 may include logic for one or more safety critical features, such as safety critical features in automotive systems, or any other suitable logic to be protected. Further, each of first safety logic 110, second safety logic 112, and third safety logic 114 may include one or more electrical components, such as processing cores (e.g., CPU, GPU, AI processing engines), gates, memory components, or any other electrical component.

Processor 106 may include one or more processing cores, and may be, for instance, a GPU, a CPU, or a microcontroller, among other examples. Although integrated circuit package 100 illustrates processor 106 and external processor 116, in some examples, processor 106 may perform at least some of the operations described herein with respect to external processor 116. Similarly, in at least some examples, external processor 116 may perform at least some of the operations described herein with respect to processor 106.

Referring back to FIG. 1, processor 106 can communicate with the clock logic 104 over communication bus 107. For example, processor 106 may perform write operations over communication bus 107 to write to one or more configuration storage locations (e.g., registers) of the clock logic 104 to establish the frequency of the input clock signal 105. Processor 106 can also communicate with voltage logic 120 over communication bus 123. As an example, processor 106 may perform write operations over communication bus 123 to write to one or more configuration storage locations of the voltage logic 120 that establish the supply voltage provided on each of the one or more voltage rails 121.

Further, processor 106 can communicate with ACD logic 102 over communication bus 125. For example, processor 106 may perform write operations over communication bus 125 to write to one or more configuration storage locations of the ACD logic 102 that establish the frequency of the output clock signal 115 when the ACD logic 102 activates.

For instance, a register of the ACD logic 102 may define a factor for dividing the input clock signal 105 to generate the output clock signal 115 when the ACD logic 102 activates. Processor 106 may read from a non-volatile memory location a value, and may write the value to the register. In some instances, processor 106 writes to the clock logic 104, voltage logic 120, and ACD logic 102 configuration storage locations as part of an SoC 101 initialization process (e.g., during a boot-up process).

Processor 106 can also read the counters of counter logic 103. For instance, processor 106 may perform read operations over communication bus 117 to read one or more of the event count counter 103A and event duration counter 103B of counter logic 103. Similarly, external processor 116 can read the counters of counter logic 103. For example, external processor 116 may perform read operations over communication bus 119 to read one or more of the event count counter 103A and event duration counter 103B of counter logic 103. In some examples, external processor 116 may transmit a request to processor 106 to receive values read from one or more of the event count counter 103A and event duration counter 103B.

To determine whether adaptive clock distribution functionality is or will operate as expected, integrated circuit package 100 may test the ACD logic 102. To test ACD logic 102, in some examples, a voltage test is performed where the supply voltage provided by the voltage logic 120 on one or more voltage rails 121 is purposely reduced to detect ACD logic 102 activations. For instance, processor 106 may write to one or more of the configuration storage locations of the voltage logic 120 to cause the supply voltage provided on a voltage rail 121 to reduce from a nominal voltage level (e.g., a level within an expected operating voltage range) to below a threshold voltage level. The threshold voltage level may be the voltage level where the ACD logic 102 is expected to activate to generate the output clock signal 115 with a reduced frequency. The supply voltage may be maintained below the threshold voltage level for an interval of time. The interval of time may be greater (e.g., a multiple) than the amount of time the ACD logic 102 is expected to wait after detecting the low supply voltage before reducing the output clock signal 115. During the interval of time, the ACD logic 102, if operating correctly, should cause the ACD event signal 131 received by counter logic 103 to indicate an event. In response, the counter logic 103 updates one or more of its counters. For example, the counter logic 103 may increment the event count counter 103A, and may periodically increment the event duration counter 103B as long as the ACD event signal 131 continues to indicate the event, as described herein. At the conclusion of the interval of time, the processor 106 may write to the one or more configuration storage locations of the voltage logic 120 to cause the supply voltage provided on the voltage rail 121 to increase back to the nominal voltage level.

Further, processor 106 may read one or more of the counters of counter logic 103 over communication bus 117. For example, processor 106 may read the event count counter 103A to obtain an event count value for the voltage test. Processor may also read the event duration counter 103B to obtain an event duration value for the voltage test. In some instances, processor 106 may transmit the event values, such as the event count value and the event duration value, to external processor 116 over communication bus 141. Alternatively, in some examples, processor 106 may transmit a signal to external processor 116 over communication bus 141. The signal indicates to external processor 116 that the counters within counter logic 103 are ready to be read. In response, external processor 116 reads, over communication bus 119, the event count counter 103A to obtain an event count value. External processor 116 may also read, over communication bus 119, the event duration counter 103B to obtain the event duration value. External processor 116 may then store the event count value and the event duration value within a memory device. For instance, external processor 116 may store the event count and event duration values as event count values 180A and event duration values 180B, respectively, within memory device 180. Memory device 180 may be, for example, a FIFO memory component of integrated circuit package 100, or any other suitable memory device.

Additionally or alternatively to the voltage test, a clock test may be performed. For F example, processor 106 may write to one or more of the configuration storage locations of the clock logic 104 to cause the clock logic 104 to generate the input clock signal 105 above a threshold frequency level. The threshold frequency level may be the frequency level where the ACD logic 102 is expected to activate to generate the output clock signal 115 with a reduced frequency. The input clock signal 105 may be maintained above the threshold frequency level for an interval of time, as described herein. During the interval of time, the ACD logic 102, if operating correctly, should generate the ACD event signal 131 to indicate an event. Based on receiving the ACD event signal 131, the counter logic 103 updates one or more of its counters. At the conclusion of the interval of time, the processor 106 may write to the one or more configuration storage locations of the clock logic 104 to cause the clock logic 104 to generate the input clock signal 105 at the nominal operating frequency.

As described herein, processor 106 may read the event count counter 103A to obtain an event count value for the clock test. Processor 106 may also read the event duration counter 103B to obtain an event duration value for the clock test. In some instances, processor 106 may transmit the event values, such as the event count value and the event duration value, to external processor 116 over communication bus 141. Alternatively, in some examples, processor 106 may transmit a signal to external processor 116 over communication bus 141. The signal indicates to external processor 116 that the counters within counter logic 103 are ready to be read. In response, external processor 116 reads, over communication bus 119, the event count counter 103A to obtain the event count value and the event duration value for the clock test. External processor 116 may then store the event count value and the event duration value as event count values 180A and event duration values 180B, respectively, within the memory device 180.

In some examples, and based on the event count values 180A and/or event duration values 180B stored in memory device 180, external processor 116 may determine whether the ACD logic 102 is operating as expected (e.g., with expected or allowed tolerance levels). For example, the external processor 116 may determine whether one or more of the event values, including the event count values and the event duration values, are within a corresponding range. For example, for each event value, the external processor 116 may determine whether the event value is greater than a minimum value, and less than a maximum value. The minimum value and the maximum value of each corresponding range may be stored in memory device 180 as threshold values 180C, for example. Alternatively, in some examples, processor 106, rather than external processor 116, may determine whether the ACD logic 102 is operating as expected. For instance, the event count values 180A and/or event duration values 180B may be stored in an internal memory to the SoC 101, such as registers located within the counter logic 103. Processor 106 may read the event count values 180A and/or event duration values 180B, and may determine whether one or more of the event values, including the event count values and the event duration values, are within a corresponding range.

Further, the external processor 116 may generate a test status value 180D for a corresponding test based on determining whether an event value is within a corresponding range. For instance, if an event value for a particular test (e.g., voltage test, clock test) is within the corresponding range, the external processor 116 may generate a first test status value 180D (e.g., 0, indicating no error) for the particular test. If, however, the event value for the particular test is not within the corresponding range, the external processor 116 may generate a second test status value 180D (e.g., 1, indicating error). The external processor 116 may store the test status values 180D within memory device 180.

In some examples, the external processor 116 may generate a test status value 180D for a test based on a degree of the error. For example, the external processor 116 may determine, for a corresponding test, how far an event value is from its corresponding range. For instance, and assuming an event value is above its corresponding range maximum, the external processor 116 may perform operations to subtract the range maximum from the event value to determine an event offset. The external processor 116 may generate the test status value 180D for the test based on the event offset. For example, the external processor 116 may generate a first test status value 180D indicating a "warning" if the event offset falls within a first range (e.g., at or within 20% of the range maximum), and may generate a second test status value 180D indicating an "error" if the event offset falls within a second range (e.g., greater than 20% of the range maximum). The external processor 116 may store the test status values 180D within memory device 180.

Further, and based on the test status values 180D, the external processor 116 may generate an ACD status signal 129. The ACD status signal 129 may indicate a status of the ACD logic 102. For example, if any of the test status values 180D indicate an error, the external processor 116 may generate the ACD status signal 129 to indicate that the ACD logic 102 is not operating properly. In some examples, the ACD status signal 129 further indicates the extent of the errors. For instance, if any test status value 180D indicates an "error," the external processor 116 generates the ACD status signal 129 to indicate an ACD logic 102 "error." Otherwise, if no test status value 180D indicates an "error," the external processor 116 generates the ACD status signal 129 to indicate an ACD logic 102 "warning." A "warning" may indicate that, although ACD logic 102 performance has degraded to a preconfigured warning level, the performance has not degraded to the "error" level. The ACD status signal 129 may be received by other integrated circuit packages, for example.

In some instances, the external processor 116 may transmit an additional signal to processor 106 over communication bus 141, where the additional signal indicates to processor 106 that the ACD logic 102 should be disabled. For example, if the external processor 116 determines the ACD logic 102 is not operating correctly, the external processor 116 may transmit the additional signal to the processor 106. In some examples, the external processor 116 transmits the additional signal to the processor 106 only when the external processor 116 determines an ACD logic 102 "error," but not when determining an ACD logic 102 "warning." In response to receiving the additional signal, processor 106 may write to one or more configuration storage locations of ACD logic 102 to disable the ACD functionality (i.e., preventing the ACD logic 102 from activating). For instance, processor 106 may write to one or more configuration registers of the voltage logic 120 raise the minimum voltage (Vmin) provided to voltage rails 121 monitored by the ACD logic 102.

In at least some embodiments, the external processor 116 and/or the processor 106 determine whether the ACD logic 102 is operating properly (e.g., while ACD logic 102 is in use during a safety critical operation). For example, ACD logic 102 may monitor one or more supply voltages and/or the input clock signal 105 frequency as described herein, and may generate an output clock signal 115 with a reduced frequency when the supply voltage is outside a corresponding supply voltage range. In some examples, the ACD logic 102 may monitor the input clock signal 105, and may generate the output clock signal 115 with the reduced frequency when a frequency of the input clock signal 105 is outside a corresponding clock frequency range. Further, as described herein, external processor 116 may perform read operations over communication bus 119 to read the event count value from the event count counter 103A, and/or the event duration value from the event duration counter 103B. External processor 116 may compare the event count value to a corresponding range. Each corresponding range may be defined by threshold values 1800 stored within memory device 180. Similarly, external processor 116 may compare the event duration value to a corresponding range. If the event count value and/or the event duration value is outside its corresponding range, the external processor 116 may generate the ACD status signal 129 as described herein.

In some examples, the external processor 116 (or processor 106, in some examples) determines the threshold values based on characterizing ACD logic 102 activations during a startup calibration process. For instance, at startup SoC 101 may cause first safety logic 110, second safety logic 112, and third safety logic 114 to execute corresponding operations, such as to execute corresponding safety critical applications. The operations may be carried out for a predetermined amount of time. At the conclusion of the startup calibration process, the external processor 116 may determine a number of ACD logic 102 activations, including event count values from the event count counter 103A and/or event duration values from the event duration counter 103B, as described herein. The external processor 116 may determine the threshold values based on the event count values and/or event duration values. For instance, external processor 116 may determine a minimum value of a range to be zero (e.g., no events), and a maximum value of the range to be a percentage (e.g., 110%) of the corresponding event value. The external processor 116 may store the minimum value and the maximum value within the threshold values 180C of the memory device 180.

In some examples, and based on the event count values and/or event duration values, the external processor 116 may determine a minimum voltage ($V_{MIN}$) that the voltage logic 120 should provide to each of the one or more voltage rails 121. For instance, the external processor 116 may determine one of a plurality of event ranges that an event count value or event duration value (or a total of the two, for instance) fall within. Each of the plurality of event ranges may be associated with a minimum voltage. Based on the determined event range, the external processor 116 determines the corresponding minimum voltage. The external processor 116 may also generate a message that includes a value characterizing the minimum voltage, and may transmit the message to processor 106. In response to receiving the message, processor 106 writes the value characterizing the minimum voltage to a configuration storage location of the voltage logic 120 that establishes the supply voltage provided on each of the one or more voltage rails 121. In some examples, the external processor 116 may write the value to the configuration storage location of the voltage logic 120.

Figure 2A:
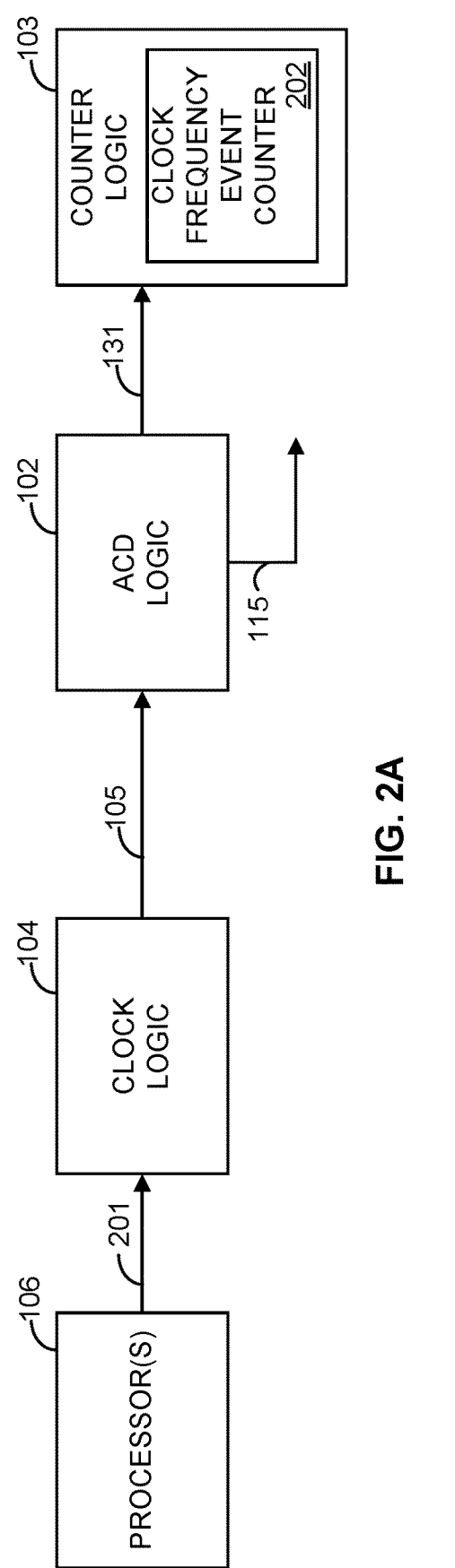
FIGS. 2A and 2B are block diagrams illustrating portions of an integrated circuit, according to some implementations.
Figure 2B:
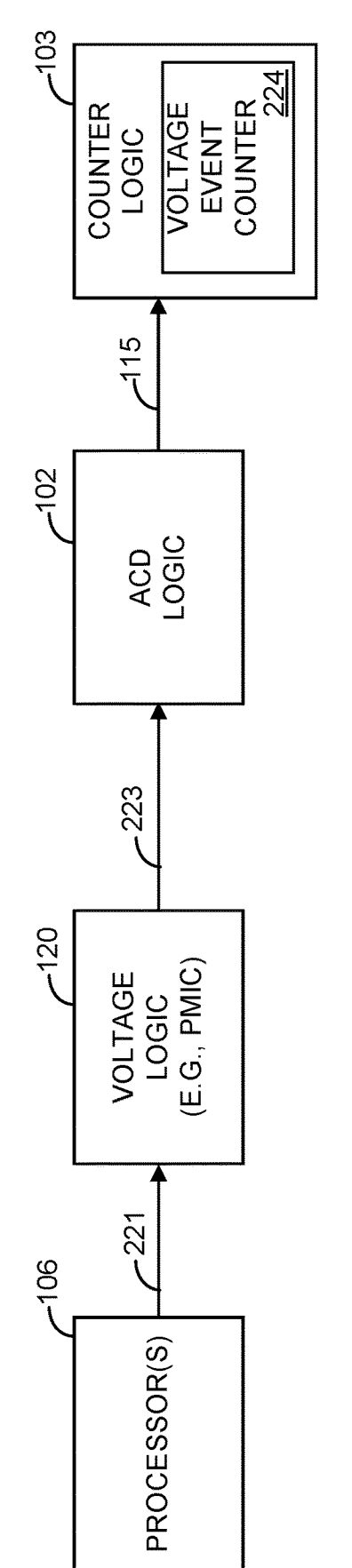

FIGS. 2A and 2B illustrate exemplary portions of the integrated circuit package 100 of FIG. 1. For instance, FIG. 2A illustrates an exemplary clock test of the ACD logic 102, and FIG. 2B illustrates an exemplary voltage test of the ACD logic 102. The voltage test and the clock test may be carried out simultaneously, serially, or sequentially.

As illustrated in FIG. 2A, to perform the clock test, processor 106 may transmit clock adjustment data 201 to clock logic 104. The clock adjustment data 201 may cause the clock logic 104 to generate the input clock signal 105 at a particular frequency. For example, the clock adjustment data 201 may include one or more values of one or more configuration storage locations of clock logic 104 that establish the frequency of the input clock signal 105. Further, the established frequency may be above the clock frequency threshold at which the ACD logic 102 is expected to activate.

Based on receiving the input clock signal 105, the ACD logic 102 generates the output clock signal 115. If the ACD logic 102 is operating correctly and activates, the ACD logic 102 generates the output clock signal 115 at a frequency that is less than the frequency of the input clock signal 105. Otherwise, if the ACD logic 102 is not operating correctly and fails to activate, the ACD logic 102 may pass the input clock signal 105 as the output clock signal 115, or may provide the output clock signal 115 at an incorrect frequency.

Further, if the ACD logic 102 does activate, the ACD logic 102 generates the ACD event signal 131, which is received by the counter logic 103. As described herein, the counter logic 103 may increment one or more counters based on the ACD event signal 131. In this example, counter logic 103 increments clock frequency event counter 202 (e.g., an event count counter 103A) when the ACD event signal 131 indicates an event (i.e., the ACD logic 102 activated).

With reference to FIG. 2B, to perform the voltage test, processor 106 may transmit voltage adjustment data 221 to voltage logic 120. The voltage adjustment data 221 may cause the voltage logic 120 to provide (e.g., over a voltage rail 121) a supply voltage 223 that is less than a voltage level at which the ACD logic 102 should activate. For example, the voltage adjustment data 221 may include one or more values of one or more configuration storage locations of voltage logic 120 that establish the voltage level of the supply voltage 223. Further, the established voltage level of the supply voltage 223 may be less than the minimum voltage level at which the ACD logic 102 is expected to activate (e.g., the ACD logic 102 is expected to activate when the voltage level is at or below the voltage level).

Based on receiving the supply voltage 223, the ACD logic 102 generates the output clock signal 115. If the ACD logic 102 is operating correctly and, because it detects the supply voltage 223 is under the minimum voltage level, activates, the ACD logic 102 generates the output clock signal 115 at a frequency that is less than the frequency of the input clock signal 105. Otherwise, if the ACD logic 102 is not operating correctly and fails to activate, the ACD logic 102 passes the input clock signal 105 as the output clock signal 115.

Further, if the ACD logic 102 does activate, the ACD logic 102 generates the ACD event signal 131, which is received by the counter logic 103. In this example, counter logic 103 increments voltage event counter 224 (e.g., an event count counter 103A) when the ACD event signal 131 indicates an event (i.e., the ACD logic 102 activated).

Figures 3A, 3B:
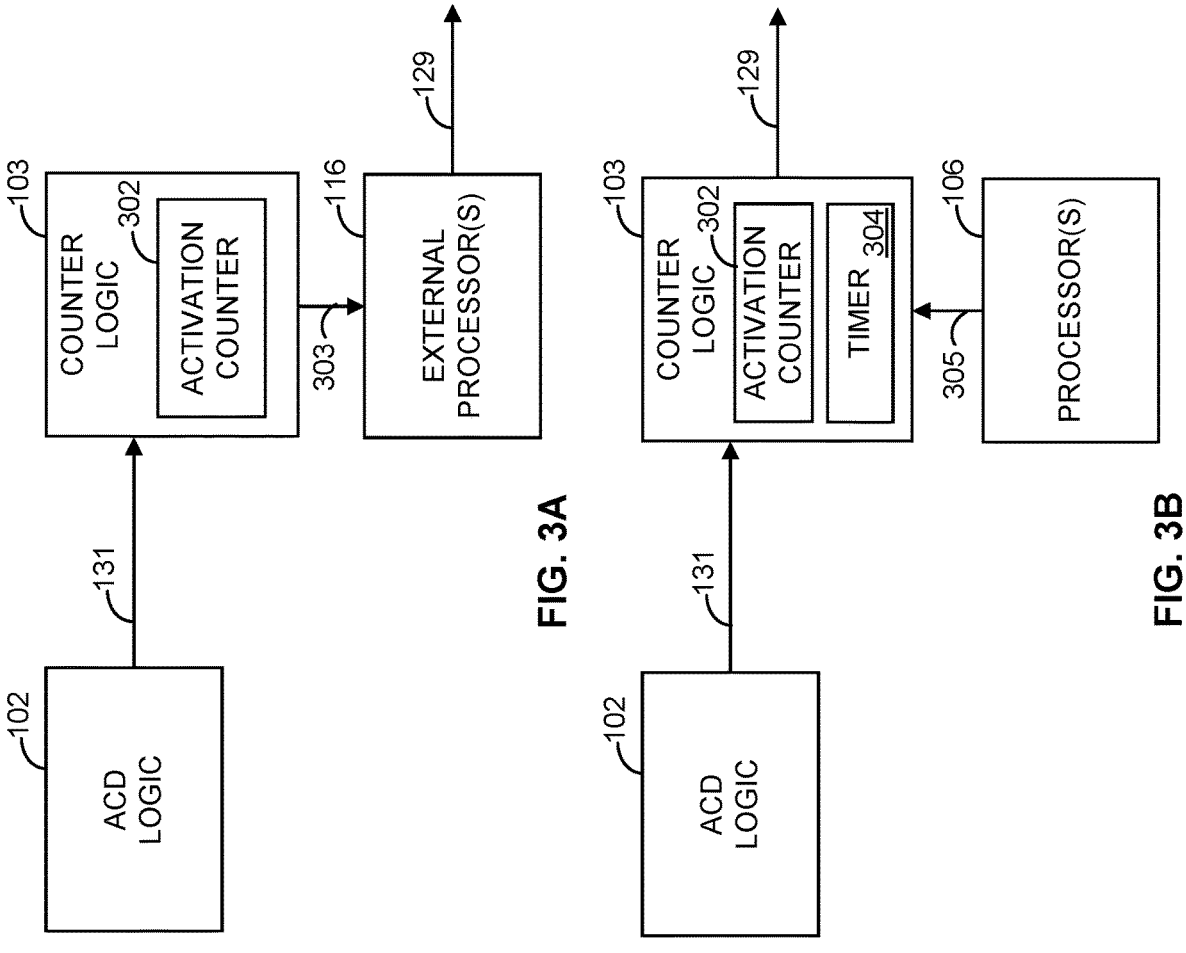
FIGS. 3A and 3B are block diagrams illustrating portions of an integrated circuit, according to some implementations.

FIGS. 3A and 3B illustrate exemplary portions of the integrated circuit package 100 of FIG. 1. With reference to FIG. 3A, counter logic 103 includes an activation counter 302 that increments in response to any ACD activations indicated by the ACD event signal 131. For example, during a voltage test, the ACD logic 102 may generate the ACD event signal 131 to indicate an event in response to detecting that a supply voltage (e.g., supply voltage provided on a voltage rail 121) falls below a corresponding voltage threshold. Similarly, the ACD logic 102 may, during a clock test, generate the ACD event signal 131 to indicate an event in response to detecting that a frequency of an input clock signal (e.g., input clock signal 105) rises above a corresponding clock frequency threshold. To determine an activation event count, the external processor 116 may read the activation counter 302 to obtain activation count data 303. In some examples, processor 106 reads the activation counter 302 to obtain activation count data 303, and the activation counter 302 requests and receives from the processor 106 the activation count data 303. The activation count data 303 identifies an activation count, i.e., a number of times the ACD logic 102 has activated over a temporal interval. In some examples, when read, the activation counter 302 resets to an initial value (e.g., to zero).

In some examples, and during testing of the ACD logic 102 (e.g., performing the voltage test and the clock test), the external processor 116 may occasionally read the activation counter 302 to obtain the activation count data 303. For instance, the external processor 116 may read the activation counter 302 at the conclusion of each voltage test or clock test. The external processor 116 may further compare the activation count identified by the activation count data 303 with a corresponding range (e.g., as defined by the threshold values 180C in memory device 180). If the activation count is not within the corresponding range, the external processor 116 may generate the ACD status signal 129 as described herein. For example, if ten voltage tests are to be performed (e.g., the supply voltage was reduced and brought back to nominal voltage level ten times), the activation count may be expected to be ten. The corresponding range may then be eight to twelve, for instance. If the activation count, when read at the end of the ten tests, is not within the range of eight to twelve, the external processor 116 may generate the ACD status signal 129 to indicate an ACD logic 102 error.

In at least some of the embodiments described herein, the external processor 116 may determine whether the ACD logic 102 is operating correctly during operation (e.g., while ACD logic 102 is in use during a safety critical operation). For example, while ACD logic 102 is monitoring a supply voltage and/or input clock signal frequency to determine whether to reduce a frequency of an output signal clock as described herein, the external processor 116 may occasionally (e.g., periodically) read the activation counter 302 to obtain the activation count data 303. In some instances, the external processor may read the activation counter 302 periodically at a rate of anywhere from every 10 milliseconds to every 35 milliseconds, inclusive. For instance, the external processor 116 may read the activation counter 302 every 10 milliseconds. For each read of the activation counter 302, the external processor 116 may compare the activation count identified by the activation count data 303 with a corresponding range (e.g., as defined by the threshold values 180C in memory device 180), and may generate the ACD status signal 129 based on the comparison. For instance, the corresponding range may include a minimum value (e.g., zero) and a maximum value (e.g., greater than zero). If the activation count is not greater than or equal to the minimum value, and less than or equal to the maximum value, the external processor 116 may generate the ACD status signal 129 to indicate an error as described herein.

In FIG. 3B, in addition to activation counter 302, counter logic 103 includes a timer 304. The timer 304 may be programmed by processor 106. For example, the processor 106 may perform a write operation to write timer data 305 to the timer 304. The timer data 305 may characterize an amount of time (e.g., 10 milliseconds to 35 milliseconds). When programmed, the timer 304 may delay for the programmed amount of time and, upon expiration of the programmed amount of time, may generate a timer expiration signal. In response to detecting the timer expiration signal, the counter logic 103 reads the activation counter 302 to obtain the activation count. Further, the counter logic 103 may compare the activation count identified by the activation count data 303 with a corresponding range (e.g., which the processor 106 may program into additional storage locations of counter logic 103), and may generate the ACD status signal 129 based on the comparison. For example, the counter logic 103 may generate the ACD status signal 129 when the activation count is outside the corresponding range. The ACD status signal 129 may indicate a FUSA_WARNING when the activation count data 303 is at or above a first threshold but below a second threshold, and may indicate a FUSA_ERROR when the activation count data 303 is at or above the second threshold, for example.

Figures 4A, 4B:
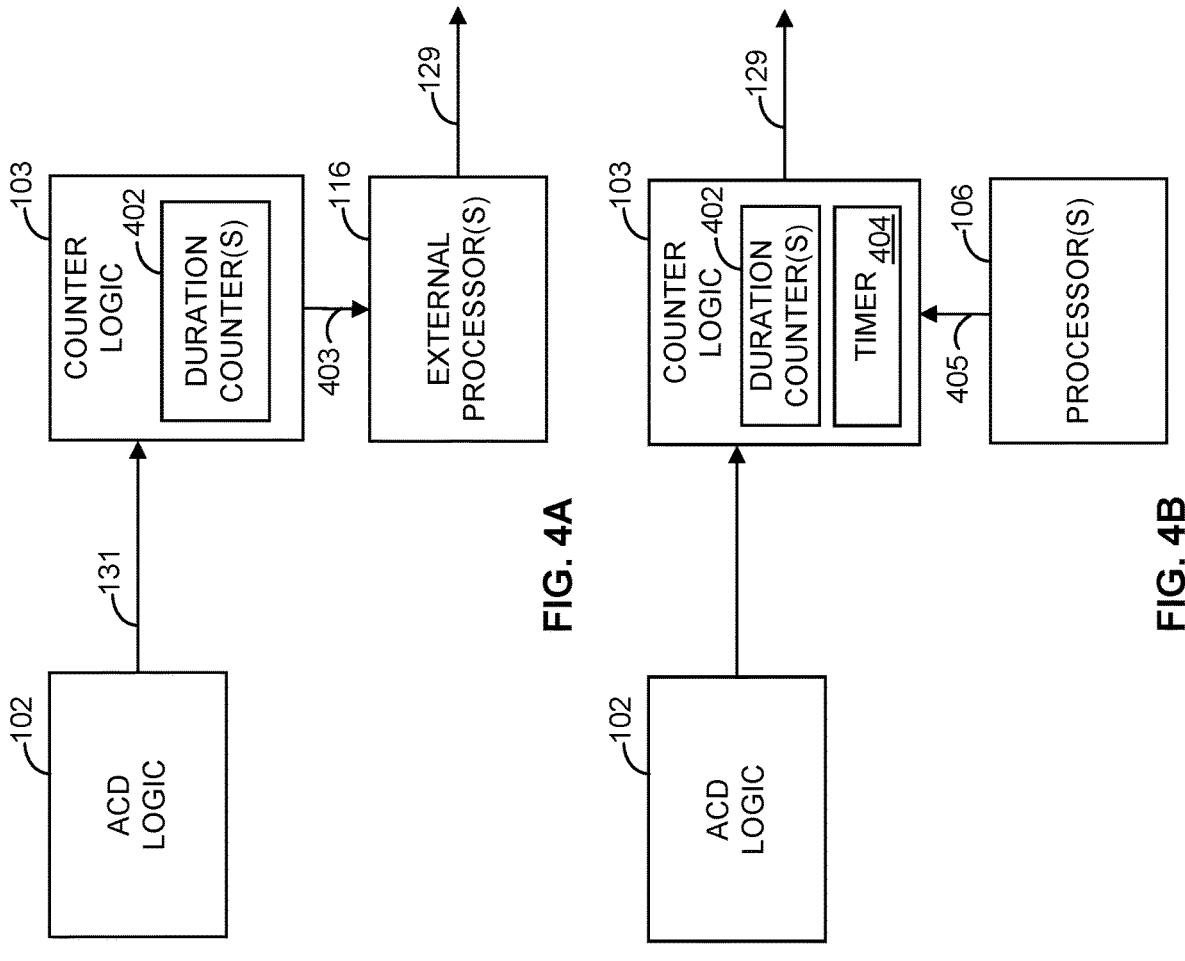
FIGS. 4A and 4B are block diagrams illustrating portions of an integrated circuit, according to some implementations.

FIGS. 4A and 4B illustrate exemplary portions of the integrated circuit package 100 of FIG. 1. With reference to FIG. 4A, counter logic 103 includes one or more duration counters 402 that increment periodically (e.g., every nanosecond, a microsecond, 10 microseconds, etc.) while the ACD event signal 131 indicates an event. For instance, as described herein, the ACD logic 102 may generate the ACD event signal 131 to indicate an event when the ACD logic 102 detects that a supply voltage is below a corresponding voltage threshold, or when the ACD logic 102 detects a frequency of an input clock signal is above a corresponding frequency threshold. In one example, a duration counter 402 is configured to measure a duration count over a single activation event. For example, the duration counter 402 may include a counter and a FIFO. Upon receiving ACD event signal 131 indicating an event, the duration counter 402 begins to increment periodically from an initial value (e.g., zero) until the ACD event signal 131 indicates no event. When the ACD event signal 131 indicates no event, the value within the duration counter 402 is stored within the FIFO. The duration counter 402 is then reset, and begins incrementing from an initial value (e.g., zero) in response to additional events as indicated by the ACD event signal 131. When the duration counter 402 is read, the values within the FIFO are provided.

In another example, a duration counter 402 is configured to measure a duration count over multiple activation events. For example, the duration counter 402 may increment periodically until the ACD event signal 131 indicates no event. Once the ACD event signal 131 indicates an additional event, the duration counter 402 continues to increment periodically (e.g., without resetting). The duration counter 402 may reset when read (e.g., by external processor 116).

To determine a duration event count, the external processor 116 may read the duration counter 402 to obtain duration count data 403. The duration count data 403 characterizes an amount of time during which the ACD logic 102 was activated (e.g., during one activation event, or over multiple activation events). In some examples, when read, the duration counter 402 resets to an initial value (e.g., to zero).

In some examples, and during testing of the ACD logic 102 (e.g., performing the voltage test and the clock test), the external processor 116 may occasionally read the duration counter 402 to obtain the duration count data 403. For instance, the external processor 116 may read the duration counter 402 at the conclusion of each voltage test or clock test. The external processor 116 may further compare the duration count identified by the duration count data 403 with a corresponding range (e.g., as defined by the threshold values 180C in memory device 180). If the duration count is not within the corresponding range, the external processor 116 may generate the ACD status signal 129 to indicate an ACD logic 102 event as described herein.

In at least some of the embodiments described herein, the ACD logic 102 may be monitored during operation (e.g., while ACD logic 102 is in use during a safety critical operation). For example, while ACD logic 102 is monitoring a supply voltage and/or input clock signal frequency to determine whether to reduce a frequency of an output signal clock as described herein, the external processor 116 may occasionally (e.g., periodically) read the duration counter 402 to obtain the duration count data 403. In some instances, the external processor may read the duration counter 402 periodically at a rate of anywhere from every 10 milliseconds to every 35 milliseconds, inclusive. For instance, the external processor 116 may read the duration counter 402 every 10 milliseconds. For each read of the duration counter 402, the external processor 116 may compare the duration count identified by the duration count data 403 with a corresponding range (e.g., as defined by the threshold values 180C in memory device 180), and may generate the ACD status signal 129 based on the comparison. For instance, the corresponding range may include a minimum value and a maximum value. If the duration count is not greater than or equal to the minimum value, and less than or equal to the maximum value, the external processor 116 may generate the ACD status signal 129 to indicate an error as described herein.

In FIG. 4B, in addition to duration counter 402, counter logic 103 includes a timer 404. The timer 404 may be programmed by processor 106. For example, the processor 106 may perform a write operation to write timer data 405 to the timer 404. The timer data 405 may characterize an amount of time (e.g., 10 milliseconds to 35 milliseconds). When programmed, the timer 404 may delay for the programmed amount of time and, upon expiration of the programmed amount of time, may generate a timer expiration signal. In response to detecting the timer expiration signal, the counter logic 103 may read the duration counter 402 to obtain the duration count. Further, the counter logic 103 may compare the duration count identified by the duration count data 403 with a corresponding range (e.g., which the processor 106 may program into additional storage locations of counter logic 103), and may generate the ACD status signal 129 based on the comparison. For example, the counter logic 103 may generate the ACD status signal 129 when the duration count is outside its corresponding range.

Figure 5A:
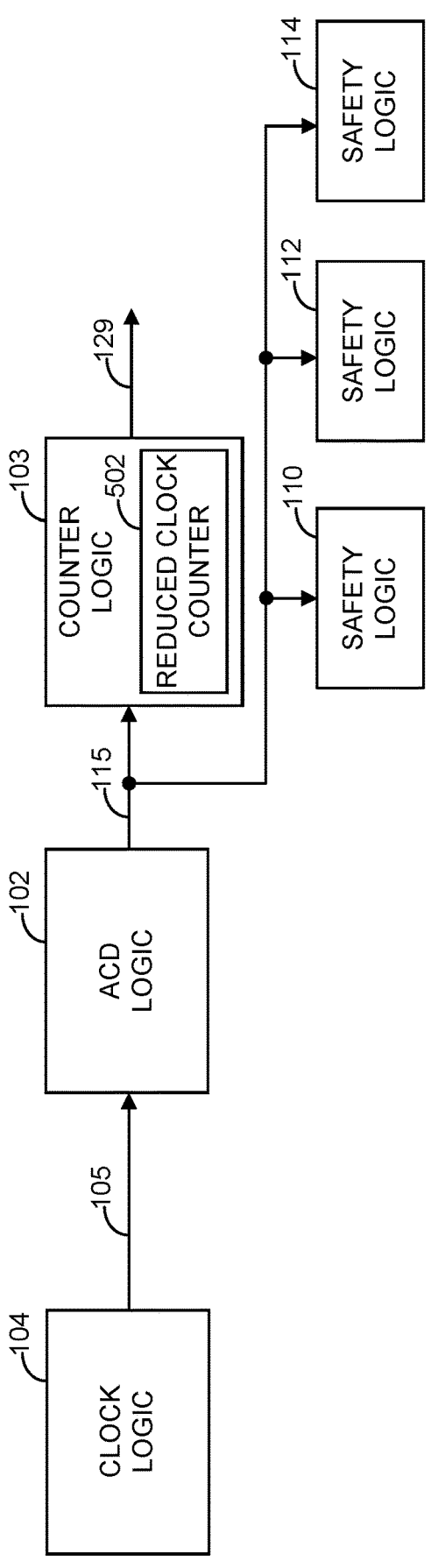
FIGS. 5A, 5B, and 5C are block diagrams illustrating portions of an integrated circuit, according to some implementations.
Figure 5B:
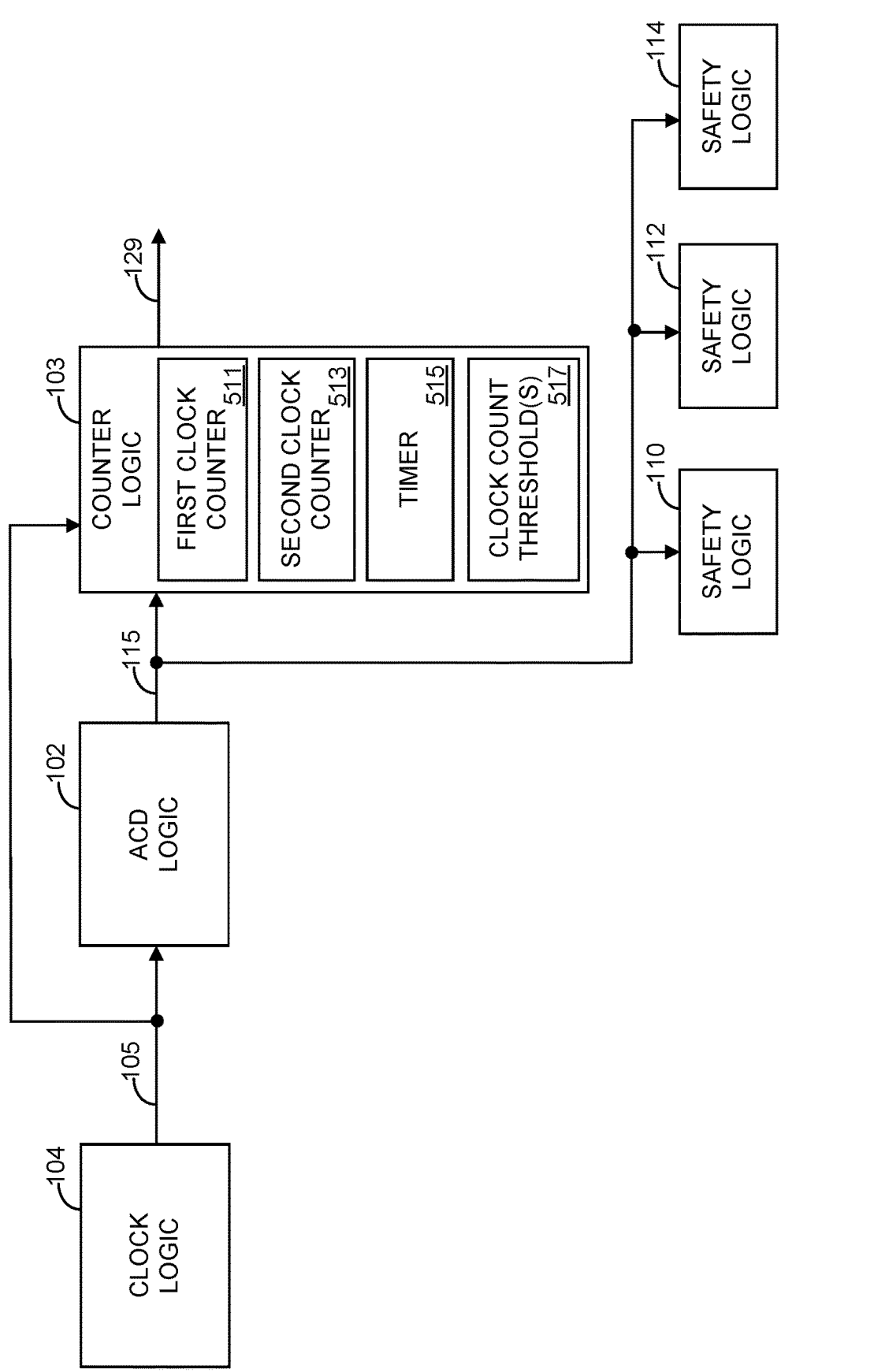
Figure 5C:
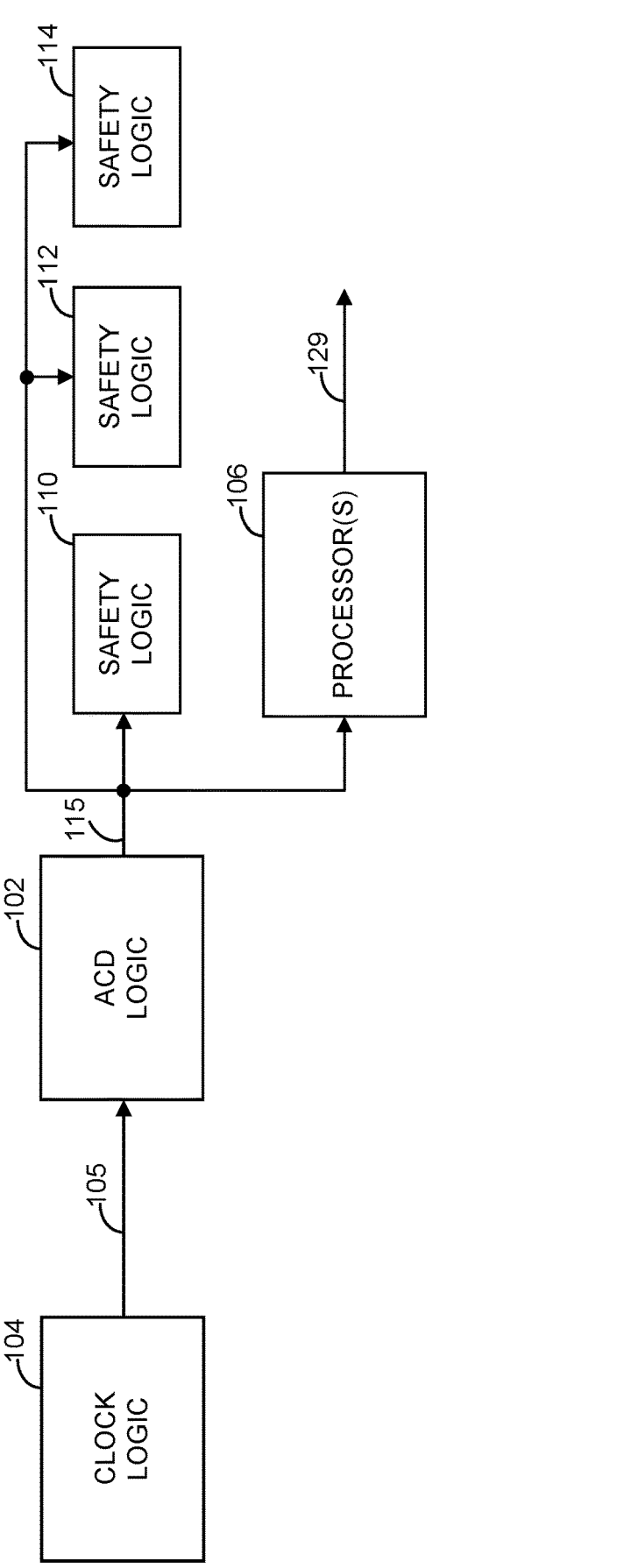

FIGS. 5A, 5B, and 5C illustrate exemplary portions of the integrated circuit package 100 of FIG. 1. In these examples, the output clock signal 115 from the ACD logic 102 is monitored to detect errors. For example, with reference to FIG. 5A, ACD logic 102 receives the input clock signal 105 from the clock logic 104 and, when the ACD logic 102 activates, generates the output clock signal 115 at a frequency lower than that of the input clock signal 105. As described herein, for example, the ACD logic 102 may divide the input clock signal 105 by a factor to generate the output clock signal 115. In this example, counter logic 103 receives the output clock signal 115, which is also provided to first safety logic 110, second safety logic 112, and third safety logic 114. The counter logic 103 detects when the output clock signal 115 is operating at a reduced frequency and, in response, increments a reduced clock counter 502 periodically. For example, the counter logic 103, when detecting that the output clock signal 115 is operating at a reduced frequency, may increment the reduced clock counter 502 every microsecond.

Further, the counter logic 103 may compare the value within the reduced clock counter 502 to a reduced clock threshold value (e.g., as defined by a threshold value 180C stored in memory device 180 and programmed into the counter logic 103 by processor 106), and may generate the ACD status signal 129 when the value exceeds the reduced clock threshold value. In some examples, the counter logic 103 generates the ACD status signal 129 to indicate an ACD logic 102 "warning" when the value is at or above a first reduced clock threshold value but below a second reduced clock threshold value, and generates the ACD status signal 129 to indicate an ACD logic 102 "error" when the value is at or above the second reduced clock threshold value.

As illustrated in FIG. 5B, in some instances, the counter logic 103 includes two clock counters, where a first clock counter 511 increments based on the input clock signal 105, and a second clock counter 513 increments based on the output clock signal 115. The clock logic 103 may further include a timer 515 that defines a time interval. When the timer expires, the clock logic 103 may read the first clock counter 511 to obtain an input clock count, and may read the second clock counter 513 to obtain an output clock count. The clock logic 103 may determine a difference between the input clock count and the output clock count, and may compare the difference to one or more clock count threshold values, which may be programmed in clock count threshold registers 517. The counter logic 103 may generate the ACD status signal 129 based on the comparison. For example, the counter logic 103 may generate the ACD status signal 129 to indicate an ACD logic 102 "warning" when the difference is at or above a first clock count threshold value but below a second clock count threshold value, and generates the ACD status signal 129 to indicate an ACD logic 102 "error" when the value is at or above the second clock count threshold value.

With respect to FIG. 5C, and as described with respect to FIG. 5A, ACD logic 102 receives the input clock signal 105 from the clock logic 104 and, when the ACD logic 102 activates, generates the output clock signal 115 at a frequency lower than that of the input clock signal 105. In this example, however, processor 106 receives the output clock signal 115, and determines a duration at which the output clock signal 115 remains at a reduced frequency. For instance, processor 106 may receive the output clock signal 115 on an input/output (I/O) pin.

In addition, the processor 106 may sample the output clock signal 115 to determine whether the frequency of the output clock signal 115 is at a nominal level, or at a reduced level. As an example, assume the output clock signal 115 is operating at a nominal frequency. The processor 106 may periodically sample the output clock signal 115 (e.g., at twice the nominal frequency) to determine that the output clock signal 115 is operating at the nominal frequency. Further, assume that the ACD logic 102 activates (e.g., in response to detecting a supply voltage droop event, during a voltage test, etc.), and reduces the frequency of the output clock signal 115, such as to half of the nominal frequency.

The processor 106, continuing to periodically sample the output clock signal 115, may determine that the frequency of the output clock signal 115 has been reduced. In response to the determination, the processor 106 may begin to maintain within a storage location (e.g., an internal memory device) data characterizing a duration of how long the output clock signal 115 has been reduced. For instance, the processor 106 may increment a duration count within a register every time processor 106 samples the output clock signal 115 and determines the frequency of the output clock signal 115 remains reduced. The processor 106 may continue to update the duration count within the register until the processor 106 determines that the output clock signal 115 is operating at the nominal frequency.

While the processor 106 determines that output clock signal 115 is operating at the reduced frequency up to when the processor 106 determines that the frequency of the output clock signal 115 is back at the nominal level, the processor 106 may compare the duration count to a reduced clock threshold value (e.g., as defined by a threshold value 180C stored in memory device 180 and programmed into the counter logic 103 by processor 106), and may generate the ACD status signal 129 when the duration count exceeds the reduced clock threshold value. In some examples, processor 106 generates the ACD status signal 129 to indicate an ACD logic 102 "warning" when the duration count is at or above a first reduced clock threshold value but below a second reduced clock threshold value, and generates the ACD status signal 129 to indicate an ACD logic 102 "error" when the value is at or above the second reduced clock threshold value.

Figure 6A:
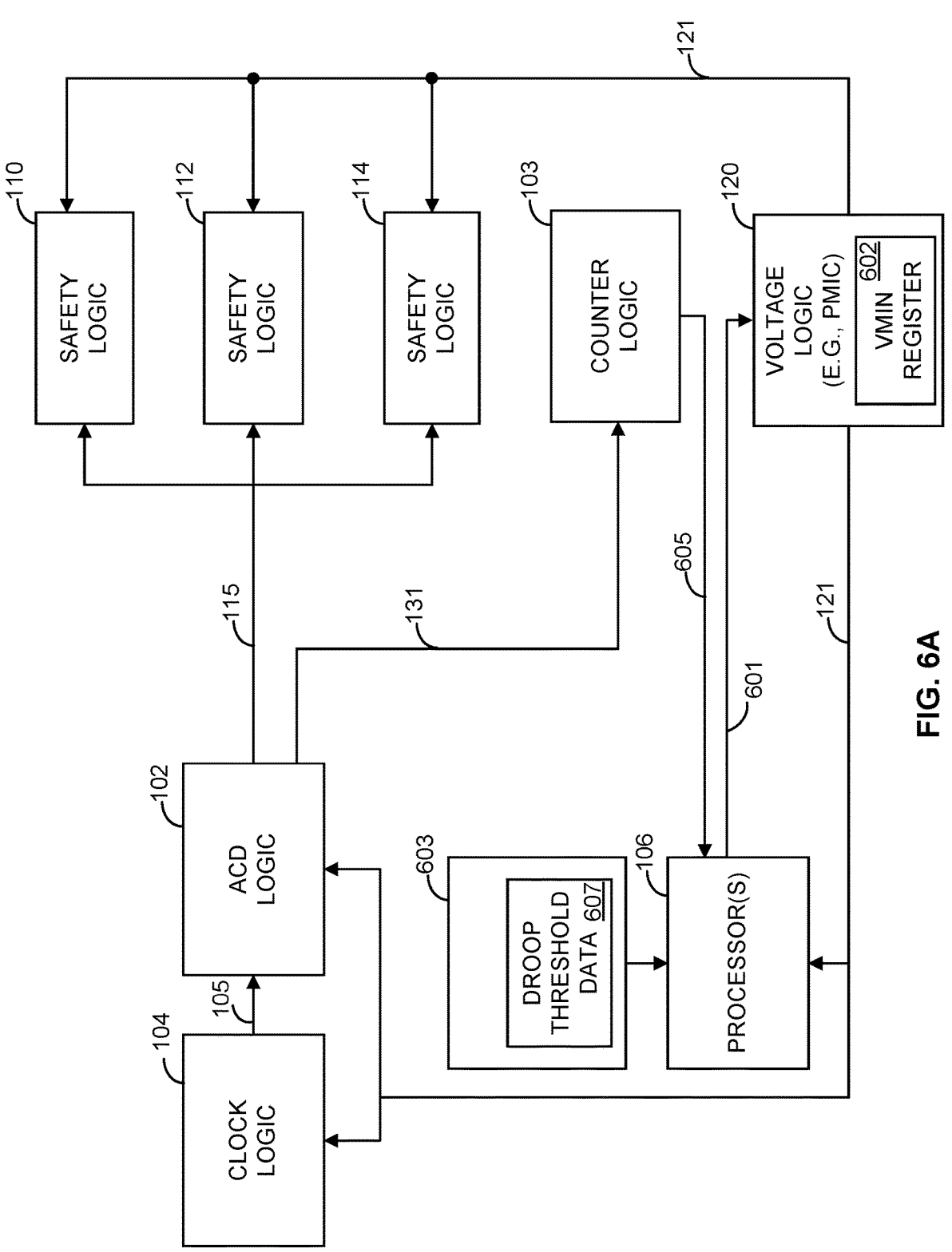
FIGS. 6A and 6B are block diagrams illustrating portions of an integrated circuit, according to some implementations.

Referring to FIG. 6A, processor 106 may perform operations (e.g., at startup) to determine a voltage level that voltage logic 120 is to provide to the voltage rail 121. For example, processor 106 may write a first value 601 to $V_{MIN}$ register 602 of voltage logic 120 (e.g., over communication bus 123) to cause the voltage logic 120 to provide a first voltage to the voltage rail 121. Further, first safety logic 110, second safety logic 112, and third safety logic 114 may execute corresponding operations. For instance, first safety logic 110, second safety logic 112, and third safety logic 114 execute corresponding safety critical applications. The operations may be carried out for a predetermined amount of time. At the conclusion of the predetermined amount of time, the processor 106 may obtain count data 605 from counter logic 103. The count data 605 may include one or more event count values from the event count counter 103A and/or event duration values from the event duration counter 103B, as described herein. The processor 106 may then compare the count data 605 (e.g., one or more event count values and/or event duration values) to corresponding threshold values. For example, processor 106 may obtain, from a memory device 603, droop threshold data 607 characterizing the threshold values. Further, processor 106 may determine whether each of the values included in the count data 605 exceeds its corresponding threshold. If the one or more event count values and/or event duration values do not exceed the corresponding threshold values, the operations to determine the voltage level are complete.

If, however, the one or more event count values and/or event duration values exceed their corresponding threshold values, processor 106 may write a second value 601 to the $V_{MIN}$ register 602 of voltage logic 120 to cause the voltage logic 120 to provide a second voltage to the voltage rail 121. The second voltage may be greater than the first voltage. The first safety logic 110, second safety logic 112, and third safety logic 114 may then re-execute corresponding operations for the predetermined amount of time where processor 106, at the conclusion of the predetermined amount of time, re-obtains the event count values and/or event duration values from the event count counter 103A and event duration counter 103B. The processor 106 again compares the one or more event count values and/or event duration values to the corresponding threshold values to determine whether the supply voltage needs to be raised further. The above operations are repeated until the voltage level is determined. In some examples, once the voltage level reaches a threshold level, the operations are complete.

Figure 6B:
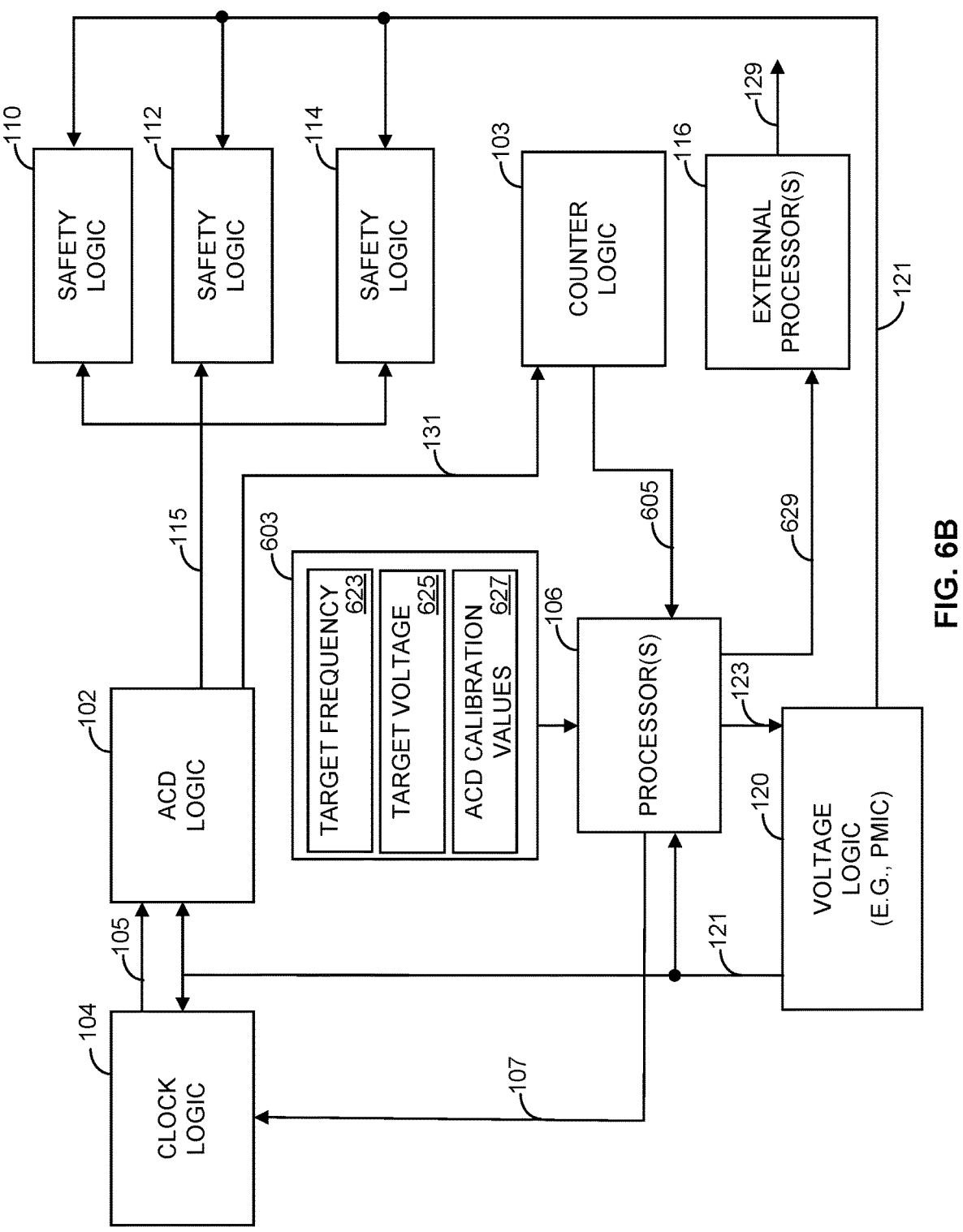

With reference to FIG. 6B, in some examples, a testing process is performed at startup (e.g., power-up) to verify the functionality and/or calibration of the ACD logic 102. For instance, at startup, processor 106 may obtain, from the memory device 603, data (e.g., calibration data) characterizing a target frequency 623 and a target voltage 625. The processor 106 may write the target voltage 625 to the voltage logic 120 (e.g., over communication bus 123) to cause the voltage logic 120 to provide the target voltage on the voltage rail 121. The processor may also write the target frequency 623 to the clock logic 104 (e.g., over communication bus 107) to cause the clock logic 104 to generate the input clock signal 105 at the target frequency.

In some examples, processor 106 may trigger ACD circuit calibration using a circuit within the ACD logic 102 that performs auto-calibration. The auto-calibration circuit generates a code indicating the calibration values. Further, processor 106 may obtain ACD calibration values 627 from the memory device 603. Processor 106 may then compare the new calibration values generated to the previous calibration values stored in memory 603. If a difference between new calibration values obtained and the previous calibration values stored in memory 603 is within a preconfigured calibration range, the testing process is considered to have successfully passed. This means that the ACD calibration values are valid for the ACD logic 102 to operate correctly. Otherwise, if the difference between the new calibration values and the previous calibration values is not within the preconfigured calibration range, the testing process may be considered failed. As such, processor 106 may generate ACD test data 629 identifying that the calibration testing process failed. In some examples, as described herein, processor 106 may write to one or more configuration registers of voltage logic 120 to increase the minimum voltage provided to the voltage rails 121 as a way to get the new calibration values within a desired range (e.g., within the preconfigured calibration margin threshold), and the testing process may be executed again. In some examples, when this at-boot test fails, processor 106 may disable the ACD logic 102 and, for possible mitigation, may write to one or more configuration registers of voltage logic 120 to increase the minimum voltage provided to the voltage rails 121 to protect against voltage droop events. In some examples, the testing process described above for at-boot testing of ACD logic 102 calibration is performed for all the valid operating voltage and operating frequency combinations for the target safety logic 110, 112 and 114.

As an additional or alternate test, in some examples, the first safety logic 110, second safety logic 112, and third safety logic 114 may execute corresponding operations for a predetermined amount of time. For instance, the first safety logic 110, second safety logic 112, and third safety logic 114 may include one or more processors that execute instructions stored in an internal memory device. The instructions may characterize a testing application, for example. At the conclusion of the predetermined amount of time, the processor 106 obtains the count data 605 from counter logic 103, including the event count values from the event count counter 103A and/or the event duration values from the event duration counter 103B. Further, processor 106 may obtain ACD calibration values 627 from the memory device 603, and may compare the count data 605 to the ACD calibration values 627 to determine whether the ACD logic 102 is operating properly. For example, the processor 106 may determine a difference between each of the event count values and/or event duration values and their corresponding ACD calibration values 627. If each of the differences are less than a first predetermined amount (e.g., two), the processor 106 generates ACD test data 629 identifying that the ACD test passed (e.g., the ACD logic 102 is operating correctly). If, however, one or more differences are the same as or greater than the first predetermined amount and less than a second predetermined amount, the processor 106 writes to the voltage logic 120 as described herein to raise the supply voltage level. For example, the processor 106 may write to a register of the voltage logic 120 cause the voltage logic 120 to raise the supply voltage level by 0.3 Volts. The processor 106 may generate the ACD test data 629 to identify that the supply voltage was raised to allow for ACD logic 102 operation. If the one or more differences are at or greater than the second predetermined amount, the processor 106 generates ACD test data 629 identifying that the ACD test failed (e.g., the ACD logic 102 is not operating correctly). In some examples, processor 106 may perform operations to disable the ACD logic 102 from activating when the one or more differences are at or greater than the second predetermined amount.

Processor 106 may transmit the ACD test data 629 to external processor 116 (e.g., over communication bus 119). In response to receiving ACD test data 629, external processor 116 may generate the ACD status signal 129. For example, if the ACD test data 629 indicates that the ACD logic 102 is not operating correctly, the external processor 116 may generate the ACD status signal 129 to indicate that the ACD logic 102 is not operating properly, as described herein.

FIG. 7 is a flowchart of an exemplary process 700 for testing adaptive clock distribution logic, in accordance with some exemplary embodiments. For example, one or more die packages, such as integrated circuit package 100, may perform one or more of the operations of exemplary process 700.

Referring to FIG. 7, at block 702, a first signal is transmitted to adjust an operating condition of adaptive clock distribution logic from a first state to a second state. For instance, and as described herein, processor 106 may write to one or more memory locations of clock logic 104 to cause clock logic 104 to increase the frequency of the input clock signal 105 received by ACD logic 102 from a nominal frequency to an increased frequency that is at or above a frequency at which the ACD logic 102 is expected to activate. Additionally or alternatively, processor 106 may write to one or more memory locations of voltage logic 120 to cause voltage logic 120 to decrease the supply voltage received by ACD logic 102 on voltage rail 121. The supply voltage is decreased from a nominal voltage level to a decreased voltage level that is below a voltage level at which the ACD logic 102 is expected to activate. At block 704, the adaptive clock distribution logic is allowed to operate for a predetermined amount of time. For instance, during the predetermined amount of time, first safety logic 110, second safety logic 112, and third safety logic 114 may perform corresponding operations, thereby pulling current from the voltage rail 121.

Proceeding to block 706, a second signal is transmitted to adjust the operating condition of the adaptive clock distribution logic from the second state to the first state. For instance, the processor 106 may write to the one or more memory locations of clock logic 104 to cause clock logic 104 to reduce the frequency of the input clock signal 105 back to the nominal frequency. Additionally or alternatively, processor 106 may write to one or more memory locations of voltage logic 120 to cause voltage logic 120 to increase the supply voltage back to the nominal voltage level. At block 708, an event count is read from a count register of the adaptive clock distribution logic. For example, processor 106 may read one or more of event count counter 103A and event duration counter 103B of counter logic 103 to determine the event count.

Further, and at block 710, a status of the adaptive clock distribution logic is determined based on the event count. For instance, processor 106 may compare one or more of the values read from the event count counter 103A and/or event duration counter 103B to corresponding threshold values to determine whether ACD logic 102 is operating correctly. Based on the status, at block 712, a third signal is transmitted. For instance, processor 106 may transmit ACD status signal 129 based on determining whether the ACD logic 102 is operating correctly.

Figure 8:
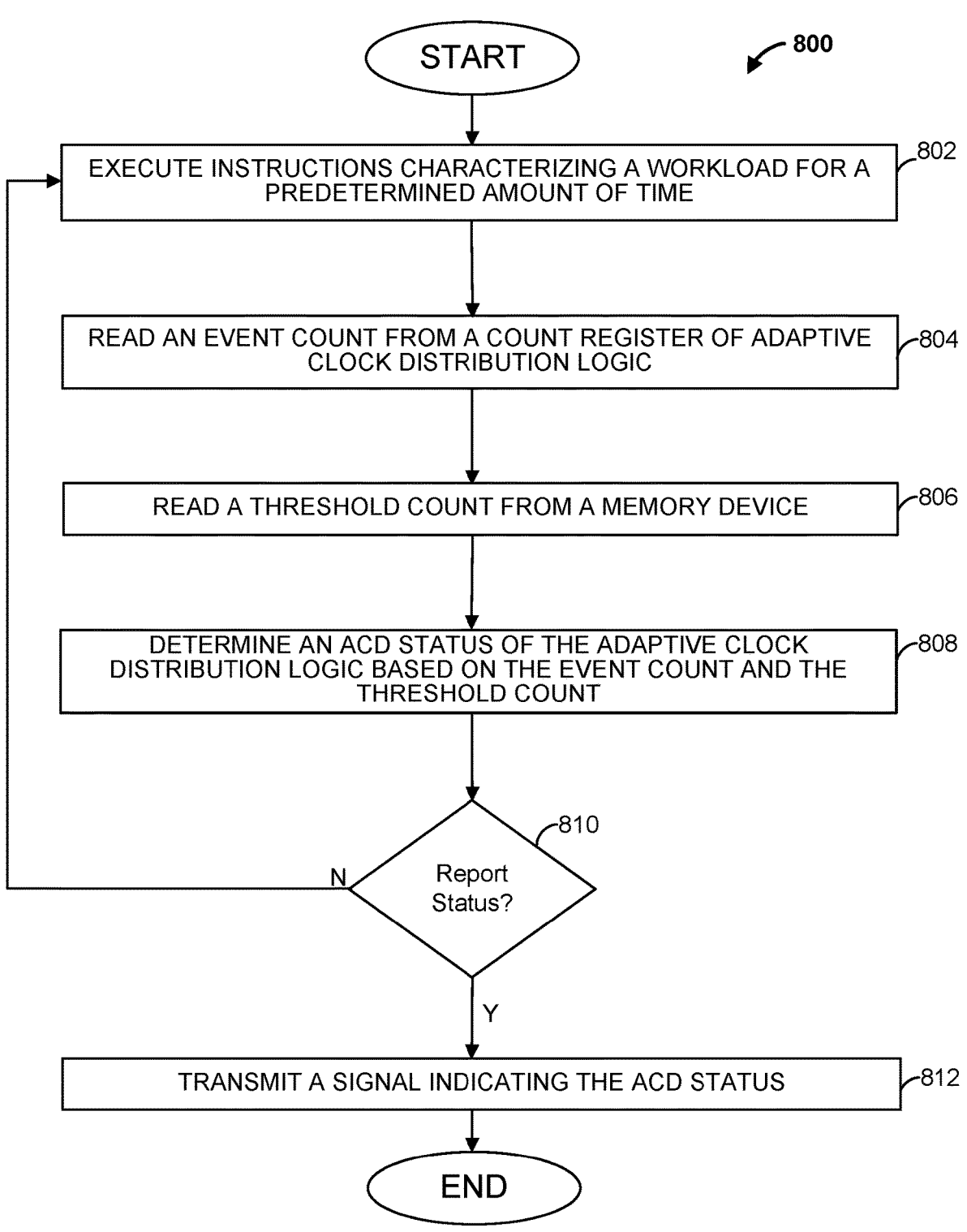
FIG. 8 is a flowchart of an exemplary process for monitoring adaptive clock distribution logic, according to some implementations.

FIG. 8 is a flowchart of an exemplary process 800 for monitoring adaptive clock distribution logic, in accordance with some exemplary embodiments. For example, one or more die packages, such as integrated circuit package 100, may perform one or more of the operations of exemplary process 800.

Referring to FIG. 8, at block 802, instructions characterizing a workload are executed for a predetermined amount of time. For example, and as described herein, one or more of first safety logic 110, second safety logic 112, and third safety logic 114 may include a processor that executes the instructions for a predetermined amount of time. The workload may be, for instance, a test workload run at startup, or a workload run during normal operations. At block 804, an event count is read from a count register of adaptive clock distribution logic. For instance, processor 106 may read the event count from one or more of event count counter 103A and event duration counter 103B of counter logic 103.

Further, at block 806, a threshold event count is read from a memory device. For instance, processor 106 may read one or more threshold values 180C from memory device 180 that characterize a threshold event count. Based on the event count and the threshold event count, at block 808, an ACD status of the adaptive clock distribution logic is determined based on the event count and the threshold count. For instance, as described herein, processor 106 may compare the event count to the threshold count, and may determine the ACD status (e.g., test status value 180D) based on the comparison. In some examples, if the event count is equal to or greater than the threshold count, the processor 106 may generate the ACD status to indicate that the ACD logic 102 is not operating properly. Otherwise, if the event count is less than the threshold count, the processor 106 may generate the ACD status to indicate that the ACD logic 102 is operating properly. In some examples, after reading the event count from the count register, processor 106 clears the count register (e.g., processor 106 writes zeros to the count register).

At block 810, processor 106 determines whether to report the ACD status. For example, if the ACD status indicates that the ACD logic 102 is not operating properly, processor 106 may determine to report the ACD status. If the ACD status indicates that the ACD logic 102 is operating properly, processor 106 may determine not to report the ACD status. If the ACD status is not being reported, the method proceeds back to block 802 to continue monitoring the ACD logic 102. If, however, the ACD status is going to be reported, the method proceeds to block 812. In some examples, processor 106 determines to report the ACD status after the ACD logic is determined to not be operating properly a number of times. For instance, processor 106 may determine to report the ACD status after the event count exceeds the threshold count three times over a predetermined time interval. At block 812, a signal is transmitted indicating the ACD status. For example, processor 106 may transmit the ACD status signal 129 to another device. In response, the other device may display a warning message that the ACD logic 102 is not operating correctly, or may perform operations to disable the ACD logic 102. In some examples, processor 106 transmits the signal to the ACD logic 102 to disable future ACD activations.

Implementation examples are further described in the following numbered clauses:

1. A die package comprising:
   adaptive clock distribution logic configured to:
      detect an activation event; and
      increment an event count within a register based on detecting the activation event; and
   a processor electrically coupled to the adaptive clock distribution logic and configured to:
      access the register and read the event count within the register;
      compare the event count to a threshold count value; and
      based on the comparison, transmit a signal to at least one component electrically coupled to the die package.

2. The die package of clause 1, wherein the processor is configured to transmit the signal to the at least one component when the event count exceeds the threshold count value.

3. The die package of clause 2, wherein the processor is configured to disable the adaptive clock distribution logic when the event count exceeds the threshold count value.

4. The die package of any of clauses 1-3, wherein the event count characterizes a number of adaptive clock distribution logic activations over a time period.

5. The die package of any of clauses 1-4, wherein the event count characterizes a duration of adaptive clock distribution logic activations.

6. The die package of any of clauses 1-5 comprising clock logic configured to provide a clock signal to the adaptive clock distribution logic, wherein the adaptive clock distribution logic is configured to detect the activation event when a frequency of the clock signal is greater than a threshold frequency.

7. The die package of clause 6, wherein the adaptive clock distribution logic is configured to detect the activation event when the frequency of the clock signal is greater than the threshold frequency for a minimum time duration.

8. The die package of any of clauses 1-7, comprising voltage logic configured to provide a voltage to the adaptive clock distribution logic, wherein the adaptive clock distribution logic is configured to detect the activation event when the voltage is less than a threshold voltage level.

9. The die package of clause 8, wherein the adaptive clock distribution logic is configured to detect the activation event when the voltage is less than the threshold voltage level for a minimum time duration.

10. The die package of any of clauses 1-9, wherein the processor is configured to:

execute a workload for a predetermined amount of time; and access and read the register of the adaptive clock distribution logic after the predetermined amount of time.

11. A method by a processor comprising:

accessing a register of adaptive clock distribution logic configured to increment an event count within the register based on detecting an activation event, and reading the event count within the register;

comparing the event count to a threshold count value; and based on the comparison, transmitting a signal to at least one device.

12. The method of clause 11, further comprising transmitting the signal to the device when the event count exceeds the threshold count value.

13. The method of clause 12, further comprising disabling the adaptive clock distribution logic when the event count exceeds the threshold count value.

14. The method of any of clauses 11-13, wherein the event count characterizes a number of adaptive clock distribution logic activations over a time period.

15. The method of any of clauses 11-14, wherein the event count characterizes a duration of adaptive clock distribution logic activations.

16. The method of any of clauses 11-15, further comprising setting a frequency of a clock signal to greater than a threshold frequency causing the adaptive clock distribution logic detect the activation event.

17. The method of any of clauses 11-16, further comprising setting a voltage level to less than a threshold voltage level causing the adaptive clock distribution logic detect the activation event.

18. The method of any of clauses 11-17, further comprising:

executing a workload for a predetermined amount of time; and accessing and reading the register of the adaptive clock distribution logic after the predetermined amount of time.

19. A non-transitory, machine-readable storage medium comprises instructions that, when executed by at least one processor, cause the at least one processor to:

access a register of adaptive clock distribution logic configured to increment an event count within the register based on detecting an activation event, and read the event count within the register;

compare the event count to a threshold count value; and based on the comparison, transmit a signal to at least one device.

20. The non-transitory, machine-readable storage medium of clause 19, wherein the instructions, when executed by the at least one processor, cause the at least one processor to transmit the signal to the at least one component when the event count exceeds the threshold count value.

21. The non-transitory, machine-readable storage medium of clause 20, wherein the instructions, when executed by the at least one processor, cause the at least one processor to disable the adaptive clock distribution logic when the event count exceeds the threshold count value.

22. The non-transitory, machine-readable storage medium of any of clauses 19-21, wherein the event count characterizes a number of adaptive clock distribution logic activations over a time period.

23. The non-transitory, machine-readable storage medium of any of clauses 19-22, wherein the event count characterizes a duration of adaptive clock distribution logic activations.

24. The non-transitory, machine-readable storage medium of any of clauses 19-23 wherein the instructions, when executed by the at least one processor, cause the at least one processor to set a frequency of a clock signal to greater than a threshold frequency causing the adaptive clock distribution logic detect the activation event.

25. The non-transitory, machine-readable storage medium of any of clauses 19-24, wherein the instructions, when executed by the at least one processor, cause the at least one processor to set a voltage level to less than a threshold voltage level causing the adaptive clock distribution logic detect the activation event.

26. The non-transitory, machine-readable storage medium of any of clauses 19-25, wherein the instructions, when executed by the at least one processor, cause the at least one processor to:

execute a workload for a predetermined amount of time; and access and read the register of the adaptive clock distribution logic after the predetermined amount of time.

27. An apparatus comprising:

a memory storing instructions; and at least one processor communicatively coupled to the memory and being configured to execute the instructions to:

access a register of adaptive clock distribution logic configured to increment an event count within the register based on detecting an activation event, and read the event count within the register;

compare the event count to a threshold count value; and based on the comparison, transmit a signal to at least one device.

28. The apparatus of clause 27, wherein the processor is configured to transmit the signal to the at least one component when the event count exceeds the threshold count value.

29. The apparatus of clause 28, wherein the processor is configured to disable the adaptive clock distribution logic when the event count exceeds the threshold count value.

30. The apparatus of any of clauses 27-29, wherein the event count characterizes a number of adaptive clock distribution logic activations over a time period.

31. The apparatus of any of clauses 27-30, wherein the event count characterizes a duration of adaptive clock distribution logic activations.

32. The apparatus of any of clauses 27-31 comprising clock logic configured to provide a clock signal to the adaptive clock distribution logic, wherein the adaptive clock distribution logic is configured to detect the activation event when a frequency of the clock signal is greater than a threshold frequency.

33. The apparatus of clause 32, wherein the adaptive clock distribution logic is configured to detect the activation event when the frequency of the clock signal is greater than the threshold frequency for a minimum time duration.

34. The apparatus of any of clauses 27-33, comprising voltage logic configured to provide a voltage to the adaptive clock distribution logic, wherein the adaptive clock distribution logic is configured to detect the activation event when the voltage is less than a threshold voltage level.

35. The apparatus of clause 34, wherein the adaptive clock distribution logic is configured to detect the activation event when the voltage is less than the threshold voltage level for a minimum time duration.

36. The apparatus of any of clauses 27-35, wherein the processor is configured to:

execute a workload for a predetermined amount of time; and access and read the register of the adaptive clock distribution logic after the predetermined amount of time.

37. A die package comprising:

clock logic configured to generate a clock signal;

adaptive clock distribution logic electrically coupled to the clock logic and configured to:

receive the clock signal from the clock logic; and increment an event count within a register when a frequency of the clock signal exceeds a threshold frequency level; and a processor electrically coupled to the clock logic and the adaptive clock distribution logic, and configured to:

transmit a first signal to the clock logic, the first signal causing the clock signal to operate above the threshold frequency level;

access the register and read the event count within the register;

determine a status of the adaptive clock distribution logic based on the event count; and transmit a second signal indicative of the status of the adaptive clock distribution logic to at least one component electrically coupled to the die package.

38. A method by a processor comprising:

transmitting a first signal to clock logic of a die, the first signal causing a clock signal output by the clock logic to operate above a threshold frequency level that causes adaptive clock distribution logic of the die to increment an event count within a register;

accessing and reading the event count within the register of the adaptive clock distribution logic of the die;

determining a status of the adaptive clock distribution logic based on the event count; and transmitting a second signal indicative of the status of the adaptive clock distribution logic to at least one component electrically coupled to the die.

39. A non-transitory, machine-readable storage medium comprises instructions that, when executed by at least one processor, cause the at least one processor to:

transmit a first signal to clock logic of a die, the first signal causing a clock signal output by the clock logic to operate above a threshold frequency level that causes adaptive clock distribution logic of the die to increment an event count within a register;

access the register and read the event count within the register of the adaptive clock distribution logic of the die;

determine a status of the adaptive clock distribution logic based on the event count; and transmit a second signal indicative of the status of the adaptive clock distribution logic to at least one component electrically coupled to the die.

40. A die package comprising:

voltage logic configured to provide a voltage to a voltage rail;

adaptive clock distribution logic electrically coupled to the voltage rail and configured to increment an event count within a register when the voltage fails to exceed a voltage threshold; and a processor electrically coupled to the voltage logic and the adaptive clock distribution logic, and configured to:

transmit a first signal to the voltage logic, the first signal causing an adjustment of the voltage to below the voltage threshold;

access the register and read the event count within the register;

determine a status of the adaptive clock distribution logic based on the event count; and transmit a second signal indicative of the status of the adaptive clock distribution logic to at least one component electrically coupled to the die package.

41. A method by a processor comprising:

transmitting a first signal to voltage logic of a die, the first signal causing an adjustment of a voltage output by the voltage logic to below a voltage threshold that causes adaptive clock distribution logic of the die to increment an event count within a register;

accessing the register and reading the event count within the register of the adaptive clock distribution logic of the die;

determining a status of the adaptive clock distribution logic based on the event count; and transmitting a second signal indicative of the status of the adaptive clock distribution logic to at least one component electrically coupled to the die.

42. A non-transitory, machine-readable storage medium comprises instructions that, when executed by at least one processor, cause the at least one processor to:

transmit a first signal to voltage logic of a die, the first signal causing an adjustment of a voltage output by the voltage logic to below a voltage threshold that causes adaptive clock distribution logic of the die to increment an event count within a register;

access the register and reading the event count within the register of the adaptive clock distribution logic of the die;

determine a status of the adaptive clock distribution logic based on the event count; and transmit a second signal indicative of the status of the adaptive clock distribution logic to at least one component electrically coupled to the die.

Although the methods described above are with reference to the illustrated flowcharts, many other ways of performing the acts associated with the methods may be used. For example, the order of some operations may be changed, and some embodiments may omit one or more of the operations described and/or include additional operations.

In addition, the methods and system described herein may be at least partially embodied in the form of computer-implemented processes and apparatus for practicing those processes. The disclosed methods may also be at least partially embodied in the form of tangible, non-transitory machine-readable storage media encoded with computer program code that, when executed, causes a machine to fabricate at least one integrated circuit that performs one or more of the operations described herein. For example, the methods may be embodied in hardware, in executable instructions executed by a processor (e.g., software), or a combination of the two. The media may include, for example, RAMs, ROMs, CD-ROMs, DVD-ROMs, BD-ROMs, hard disk drives, flash memories, or any other non-transitory machine-readable storage medium. When the computer program code is loaded into and executed by a computer, the computer becomes an apparatus for causing a machine to fabricate the integrated circuit. The methods may also be at least partially embodied in the form of a computer into which computer program code is loaded or executed, such that, the computer becomes a special purpose computer for causing a machine to fabricate the integrated circuit. For instance, when implemented on a general-purpose processor, computer program code segments can configure the processor to create specific logic circuits. The methods may alternatively be at least partially embodied in application specific integrated circuits or any other integrated circuits for performing the methods.

In addition, terms such as "circuit," "circuitry," "logic," and the like can include, alone or in combination, analog circuitry, digital circuitry, hardwired circuitry, programmable circuitry, processing circuitry, hardware logic circuitry, state machine circuitry, and any other suitable type of physical hardware components. Further, the embodiments described herein may be employed within various types of devices such as networking devices, telecommunication devices, smartphone devices, gaming devices, enterprise devices, storage devices (e.g., cloud storage devices), automotive systems (e.g., collision avoidance systems, object detection systems, navigation systems, etc.), and computing devices (e.g., cloud computing devices), among other types of devices.

The subject matter has been described in terms of exemplary embodiments. Because they are only examples, the claimed inventions are not limited to these embodiments. Changes and modifications may be made without departing the spirit of the claimed subject matter. It is intended that the claims cover such changes and modifications.

We claim:

1. A die package comprising:
safety logic for supplying one or more functions that support operation of an automobile;
adaptive clock distribution logic coupled to the safety logic for protecting the safety logic from irregularities in at least one of clock frequency and voltage, the adaptive clock distribution logic supplying an output clock signal to the safety logic;
the adaptive clock distribution logic configured to:
detect an activation event;
change a frequency of the output clock signal based on detecting the activation event; and
increment an event count within a register based on detecting the activation event; and
a processor electrically coupled to the adaptive clock distribution logic and configured to:
access the register and read the event count within the register;
compare the event count to a threshold count value; and
based on a result of the comparison of the event count to the threshold value, transmit a signal to at least one component electrically coupled to the die package, the signal indicating performance of the adaptive clock distribution logic.

2. The die package of claim 1, wherein the processor is configured to transmit the signal to the at least one component when the event count exceeds the threshold count value.

3. The die package of claim 2, wherein the processor is configured to disable the adaptive clock distribution logic when the event count exceeds the threshold count value.

4. The die package of claim 1, wherein the event count characterizes a number of adaptive clock distribution logic activations over a time period.

5. The die package of claim 1, wherein the event count characterizes a duration of adaptive clock distribution logic activations.

6. The die package of claim 1 comprising clock logic configured to provide an input clock signal to the adaptive clock distribution logic, wherein the adaptive clock distribution logic is configured to detect the activation event when a frequency of the input clock signal is greater than a threshold frequency.

7. The die package of claim 6, wherein the adaptive clock distribution logic is configured to detect the activation event when the frequency of the input clock signal is greater than the threshold frequency for a minimum time duration.

8. The die package of claim 1, comprising voltage logic configured to provide a voltage to the adaptive clock distribution logic, wherein the adaptive clock distribution logic is configured to detect the activation event when the voltage is less than a threshold voltage level.

9. The die package of claim 8, wherein the adaptive clock distribution logic is configured to detect the activation event when the voltage is less than the threshold voltage level for a minimum time duration.

10. The die package of claim 1, wherein the processor is configured to:
execute a workload for a predetermined amount of time;
access and read the register of the adaptive clock distribution logic after the predetermined amount of time.

11. A method by a processor comprising:
accessing a register of adaptive clock distribution logic configured to increment an event count within the register based on the adaptive clock distribution logic detecting an activation event and the adaptive clock distribution logic changing a frequency of an output clock signal transmitted to safety logic; the safety logic supplying one or more functions that support operation of an automobile; the adaptive clock distribution logic coupled to the safety logic for protecting the safety logic from irregularities in at least one of clock frequency and voltage;
reading the event count within the register;
comparing the event count to a threshold count value; and
based on the comparing of the event count to the threshold count value, transmitting a performance signal to at least one device, the signal indicating performance of the adaptive clock distribution logic.

12. The method of claim 11, further comprising transmitting the performance signal to the device when the event count exceeds the threshold count value.

13. The method of claim 12, further comprising disabling the adaptive clock distribution logic when the event count exceeds the threshold count value.

14. The method of claim 11, wherein the event count characterizes a number of adaptive clock distribution logic activations over a time period.

15. The method of claim 11, wherein the event count characterizes a duration of adaptive clock distribution logic activations.

16. The method of claim 11, further comprising setting a frequency of the output clock signal to greater than a threshold frequency causing the adaptive clock distribution logic detect the activation event.

17. The method of claim 11, further comprising setting a voltage level to less than a threshold voltage level causing the adaptive clock distribution logic detect the activation event.

18. The method of claim 11, further comprising:

executing a workload for a predetermined amount of time;

accessing and reading the register of the adaptive clock distribution logic after the predetermined amount of time.

19. A non-transitory, machine-readable storage medium comprises instructions that, when executed by at least one processor, cause the at least one processor to:

access a register of adaptive clock distribution logic configured to increment an event count within the register based on the adaptive clock distribution logic detecting an activation and the adaptive clock distribution logic changing a frequency of an output clock signal transmitted to safety logic; the safety logic supplying one or more functions that support operation of an automobile; the adaptive clock distribution logic coupled to the safety logic for protecting the safety logic from irregularities in at least one of clock frequency and voltage;

read the event count within the register;

compare the event count to a threshold count value; and based on a result of the comparison of the event count to the threshold value, transmit a performance signal to at least one device, the signal indicating performance of the adaptive clock distribution logic.

20. An apparatus comprising:

a memory storing instructions; and at least one processor communicatively coupled to the memory and being configured to execute the instructions to:

access a register of adaptive clock distribution logic configured to increment an event count within the register based on the adaptive clock distribution logic detecting an activation event and the adaptive clock distribution logic changing a frequency of an output clock signal transmitted to safety logic; the safety logic supplying one or more functions that support operation of an automobile; the adaptive clock distribution logic coupled to the safety logic for protecting the safety logic from irregularities in at least one of clock frequency and voltage;

read the event count within the register;

compare the event count to a threshold count value; and based on a result of the comparison of the event count to the threshold value, transmit a status signal to at least one device, the status signal indicating performance of the adaptive clock distribution logic.

* * * * *